US012275231B2

(12) United States Patent
Wattyn

(10) Patent No.: US 12,275,231 B2
(45) Date of Patent: Apr. 15, 2025

(54) APPARATUS AND METHOD FOR EXPOSURE OR RELIEF PRECURSORS

(71) Applicant: XSYS PREPRESS NV, Ypres (BE)

(72) Inventor: Bart Marc Luc Wattyn, Dentergem (BE)

(73) Assignee: XSYS PREPRESS NV, Ypres (BE)

( * ) Notice: Subject to any disclaimer, the term of this patent is extended or adjusted under 35 U.S.C. 154(b) by 242 days.

(21) Appl. No.: 18/009,922

(22) PCT Filed: Jun. 21, 2021

(86) PCT No.: PCT/EP2021/066855
§ 371 (c)(1),
(2) Date: Dec. 12, 2022

(87) PCT Pub. No.: WO2021/255296
PCT Pub. Date: Dec. 23, 2021

(65) Prior Publication Data
US 2023/0264466 A1    Aug. 24, 2023

(30) Foreign Application Priority Data

Jun. 19, 2020 (NL) .................................. 2025875

(51) Int. Cl.
*B41C 1/02* (2006.01)
*G03F 7/20* (2006.01)

(52) U.S. Cl.
CPC ............... *B41C 1/025* (2013.01); *G03F 7/20* (2013.01)

(58) Field of Classification Search
CPC ......... B41C 1/025; G03F 7/20; G03F 7/2004; G03F 7/2012; G03F 7/2016; G03F 7/2022
See application file for complete search history.

(56) References Cited

U.S. PATENT DOCUMENTS

| | | | |
|---|---|---|---|
| 8,669,040 B2* | 3/2014 | Tashiro | B41C 1/05 430/296 |
| 10,732,507 B2* | 8/2020 | Wolterink | G03F 7/2004 |
| 11,718,085 B2* | 8/2023 | Fronczkiewicz | G03F 7/36 430/309 |
| 2020/0023632 A1 | 1/2020 | Boyksen | |

FOREIGN PATENT DOCUMENTS

WO        2018172374 A1    9/2018

OTHER PUBLICATIONS

International Search Report and Written Opinion, dated Sep. 3, 2021, for Application No. PCT/EP2021/066855, (14 pages).

* cited by examiner

*Primary Examiner* — Hung V Nguyen
(74) *Attorney, Agent, or Firm* — KDW Firm PLLC

(57) ABSTRACT

An apparatus for exposure of a relief precursor having a first side and an opposite second side includes a light source to expose the relief precursor during relative movement between the light source and the relief plate precursor; a moving means to cause a first relative movement between the light source and the relief precursor to expose the first side of the relief precursor, to cause a second relative movement between the light source and the relief precursor to expose the second side of the relief precursor, and to move the light source between a first position and a second position. The first and second positions are on opposite sides of a plane of the relief precursor. At least one of the first and the second relative movement is a reciprocating movement.

19 Claims, 13 Drawing Sheets

APPARATUS AND METHOD FOR EXPOSURE OR RELIEF PRECURSORS

This application is a national stage filing under 35 U.S.C. 371 of pending International Application No. PCT/EP2021/066855, filed Jun. 21, 2021, which claims priority to Netherlands Patent Application No. 2025875, filed Jun. 19, 2020, the entirety of which applications are incorporated by reference herein.

FIELD OF INVENTION

The field of the invention relates to apparatus and methods for exposure of relief precursors, in particular printing plate precursors, and more in particular for front and back-side exposure of printing plate precursors.

BACKGROUND

Relief structures can be made by transfer of image information onto an imageable layer and removing parts of the imageable layer. The formed relief may then be used to transfer the information in a printing step onto a substrate. An example of a relief precursor is a printing plate precursor. Digitally imageable flexible printing plate precursors are known, and typically comprise at least a dimensionally stable support layer, a photosensitive layer and a digitally imageable layer. The digitally imageable layer may be e.g. a laser-ablatable layer. In case of conventional printing plate precursors, the digitally imageable layer is replaced by a mask which is attached to a photosensitive layer.

To produce a printing plate from a printing plate relief precursor, according to existing methods, first a mask is written into the digitally imageable layer based on image data to be printed. Alternatively a separate mask layer containing the image information may be applied to a photosensitive layer. Following the writing of the mask, the plate is exposed through the mask with radiation such that the photosensitive layer undergoes polymerization or cross-linking or a reaction changing the solubility or fluidity of the photosensitive layer in the regions which are not covered by the mask. Following the exposure, the residues of the mask and of the non-exposed portions of the photosensitive layer are removed. This may be done with one or more liquids in a washer apparatus or by thermal development wherein non-exposed material of the photosensitive layer is liquefied by temperature increase and removed.

Exposure apparatus for printing plate precursors are known. An exposure apparatus may comprise a first light source for back exposure and a second light source for front exposure. Back exposure may be done using a set of UV light tubes. The back exposure creates a solid layer (floor) onto which the relief structures are generated. Front exposure may also be done using a set of UV light tubes or may be done using a movable UV light source, such as a movable laser or a LED bar. Some exposure apparatus only do front exposure or only do back exposure, depending on the requirements. In some cases the exposure apparatus is capable to expose from both sides and embodiments of the invention relate to such cases.

SUMMARY

The object of embodiments of the invention is to provide apparatus and methods for the exposure of a relief precursor comprising at least one photosensitive layer, allowing performing front and back exposure in a more cost-effective automated manner.

According to a first aspect of the invention, there is provided an apparatus for exposure of a relief precursor (P) comprising at least one photosensitive layer. The apparatus comprises a light source and a moving means. The light source, preferably a substantially planar light source, is configured to expose the relief precursor during relative movement of the light source relative to the relief plate precursor. The moving means is configured to cause a first relative movement between the light source and the relief precursor to expose the first side of the relief precursor, to cause a second relative movement between the light source and the relief precursor to expose the second side of the relief precursor, and to move the light source between a first and a second position on opposite sides of a plane of the relief precursor. The first and/or the second relative movement is a reciprocating movement.

Such an apparatus has the advantage that the same light source may be used for front and back exposure, thus providing a more cost-effective solution compared to apparatus having both a front and a back exposure light source. By allowing the first and/or the second relative movement to be a reciprocating movement over one of the sides, the apparatus is made flexible in use. Indeed, for example, multiple passes may be performed wherein exposure is done only during a forward trajectory of the reciprocating movement or only during a backward trajectory of the reciprocating movement, so that exposure is started in an area where the precursor has already been able to cool down to some degree.

In a preferred embodiment, both the first and the second relative movement are a reciprocating movement. In that way, the moving means can be made more compact as the movement of the light source between a first and a second position on opposite sides of a plane of the relief precursor, can be done always at the same location.

In an exemplary embodiment, the light source has an emitting side and a non-emitting side and the moving means is configured to rotate the light source, preferably 180°, when moving the light source between the first position in which the emitting side faces a first side of the relief precursor and the second position in which the emitting side faces the second side of the relief precursor. Thus, in order to move the light source between the first and the second position, the light source is translated and rotated.

In another embodiment, the light source may have two emitting sides or may be configured to emit in all directions. In that case the light source does not need to be rotated when moved between the first and the second position.

According to an exemplary embodiment, the light source substantially extends in a plane intended for being parallel to the relief precursor. However, in other embodiments, the plane of the light source may be slightly inclined relative to a plane of the relief precursor.

In a preferred embodiment the light source may comprise one or more carriers on which a plurality of light emitting elements are arranged, and the carrier may be oriented parallel to the relief precursor. For example, the light source comprises one or more carriers, e.g. one or more printed circuit boards (PCBs), on which a LED array is arranged. Preferably, the LED array comprises at least ten LEDs, more preferably at least 20 LEDs. For example, the LED array may be composed of sets of smaller arrays arranged on multiple LED PCBs arranged next to each other in the same plane. The driver circuitry for driving the LED array may be arranged on one or more separate driver PCBs. The one or more driver PCBs may be arranged in a plane parallel to and at a distance of the plane in which the multiple LED PCBs are arranged. When the relief precursor faces a first side of the multiple LED PCBs, then the one or more driver PCBs may face the other side of the multiple LED PCBs. Preferably, the distance between individual LEDs of the LED array is at least 5 mm, more preferably at least 7 mm, and preferably smaller than 100 mm, more preferably smaller than 30 mm. Such distances allow obtaining a sufficiently homogeneous irradiation intensity in a predetermined plane parallel to the plane in which the LED array is arranged.

Preferably, the LEDs of the LED array are configured to emit electromagnetic radiation with a wavelength in the region of 200 to 2000 nm, more preferably from 250 to 500 nm, even more preferably from 300 to 450 nm, most preferably from 270 to 410 nm, e.g. mainly at 365, 385, 395 or 405 nm. Preferably, the irradiation intensity delivered by the LEDs in a predetermined surface area is in the range of 0.1 to 2000 mW/cm2. For back exposure, preferably the irradiation intensity delivered by the LEDs in a predetermined surface area is between 5 and 100 mW/cm2, more preferably between 8 and 60 mW/cm2, most preferably between 10 and 50 mW/cm2. For front exposure, preferably the irradiation intensity delivered by the LEDs in a predetermined surface area is between 30 and 500 mW/cm2, more preferably between 50 and 450 mW/cm2, most preferably higher than 100 mW/cm2. The distance between the LED array and the predetermined surface area is at least 10 mm, preferably at least 20 mm and more preferably at least 35 mm. The predetermined surface area may be a surface area in the relief precursor when arranged in the apparatus or at a small distance of the relief precursor. Preferably, the dose of radiation delivered by the LEDs in the predetermined surface area is in the range of 0.01 to 200 J/cm2. For back exposure, preferably dose delivered by the LEDs in the predetermined surface area is in the range of 0.1 to 100 J/cm2, more preferably 0.5 to 50 J/cm2, most preferably 0.5 to 30 J/cm2. For front exposure, preferably dose delivered by the LEDs in the predetermined surface area is higher than 10 J/cm2, more preferably higher than 20 J/cm2.

According to an exemplary embodiment, the light source is an array of LEDs comprising a plurality of subsets of one or more LEDs, each subset being individually controllable. Preferably, the light source is configured to illuminate simultaneously a predetermined surface area. The surface area may be adjusted for different relief precursor sizes. A control means may be configured to control the plurality of subsets individually, and such that an irradiation intensity variation in the predetermined surface area is within a predetermined range. By using a LED array with individually controllable subsets of LEDs, the irradiation intensity of the subsets can be adjusted to obtain a more or less homogeneous illumination of the surface area to be illuminated. In that manner a floor with a substantially constant thickness can be achieved. Further, when a LED fails, by having a control means configured to individually control the subsets, the subsets may be controlled to compensate for the failing LEDs, so that the homogeneity is not significantly influenced, whilst the failing LED may not need to be replaced. More details about such exemplary embodiments can be found in patent application NL 2023537 in the name of the applicant, which is included herein by reference.

Preferably, the first and second relative movements are in a direction parallel to the plane of the relief precursor. In that manner, the relief precursor can be substantially homogeneously exposed during the relative movement.

In a preferred embodiment the apparatus further comprises a control means configured to control the movement means and/or the light source. Preferably, the control means is configured to control the movement means to perform consecutively the following steps: at least one first reciprocating movement to expose the first side of the relief precursor; a movement of the light source from the first position at the first side of the relief precursor to the second position at the second side of the relief precursor; at least one second reciprocating movement to expose the second side of the relief precursor; a movement from the second position to the first position. Those steps may be repeated multiple times.

Preferably, the control means is configured to control the light source such that exposure of the first side takes place during a forward and/or backward trajectory of the first reciprocating movement, and such that exposure of the second side takes place during a forward and/or backward trajectory of the second reciprocating movement. In a preferred embodiment, exposure only takes place during one trajectory, i.e. during the forward or the backward trajectory, and more preferably during the same trajectory for the first and second side, e.g. during the forward trajectory both for the first and the second side. In that manner the exposure of the first side and of the second side in started in an area which has had some time to cool down.

Preferably, the control means is configured to control the driving of the light source, and in particular to adjust the intensity emitted by the light source so that the intensity during the first relative movement is different from the intensity during the second relative movement. For example, the first relative movement can be used for front exposure, typically through a mask, and the second relative movement for back exposure. As explained above, for back exposure, preferably the irradiation intensity delivered by the LEDs in a predetermined surface area is between 5 and 100 mW/cm2, more preferably between 8 and 60 mW/cm2, most preferably between 10 and 50 mW/cm2. For front exposure, preferably the irradiation intensity delivered by the LEDs in a predetermined surface area is between 30 and 500 mW/cm2, more preferably between 50 and 450 mW/cm2, most preferably higher than 100 mW/cm2.

Preferably, the control means is configured to adjust the speed of the first and second relative movement. For example, the speed may be varied in a range between 1 and 1000 cm/s. For a portion of the trajectory of the relative movement where no exposure is required the speed may be higher. Also, depending on whether it is a front or back exposure, the speed may be varied.

In an exemplary embodiment, the at least one first reciprocating movement, which is preferably used for the front exposure through a mask, comprises a first exposing step comprising exposing during one or more exposure passes the relief precursor according to a first intensity profile and a first speed profile and a second exposing step comprising exposing during one or more exposure passes the relief precursor according to a second intensity profile different from the first intensity profile and/or a second speed profile different from the first speed profile.

Thus, optionally, both an intensity profile and a speed profile may be changed between two exposing steps. In this way, both the print quality and the power consumption may be controlled in a multi-variable manner depending on circumstances. Intensity and speed affecting both the printing quality and the efficiency (power consumption), a finer and more versatile control is achieved by controlling the first and the second exposing step according to different profiles for both intensity and speed. In this way, a wider range of relief precursors may produced while reaching for each the best printing quality at the best efficiency. Depending on the characteristics of the relief precursor (reactivity, thickness among others) to be exposed, preferably one or more fast exposure passes at a high intensity may be followed by one or more slow exposure passes at a low intensity, to mitigate heat accumulation while achieving high curing quality.

Preferably, an average speed during an exposure pass of the first exposing step is higher than an average speed during an exposure pass of the second exposing step. In this way a fast exposing step precedes a slow exposing step. Typically a fast exposing step is associated with a first intensity while a slow exposing step is associated with a lower second intensity such in this way the relief precursor does not heat up too much while forming dots during the fast exposing step, while finishing curing during the slow exposing step. Alternatively the average speed during an exposure pass of the first exposing step may be lower than the average speed during an exposure pass of the second exposing. In this way, a slow exposing step precedes a fast exposing step. In this way, the fast final exposing step at a high intensity may also serve as post-exposure step, which would thus not have to be performed as a post-treatment. Omitting or reducing the post-treatment time is reducing the total development time of the relief precursor.

Preferably, the first exposing step consists of a first number of exposure passes and the second exposing step consists of a second number of exposure passes which may be different from the first number of exposure passes. By repeating exposure passes, the dose may be distributed between the passes to further control how the exposure of the relief precursor is to be performed to obtain the desired quality and efficiency. Preferably the first number of exposure passes is higher than the second number of exposure passes. In this way the total dose can be spread between the exposure passes. More preferably, the first number of exposure passes is two or more and the second number of exposure passes is one.

According to a preferred embodiment, during the at least one first reciprocating movement, the light source is moved in exposure cycles with a first movement in a first direction (e.g. a forward direction) and a second movement in a second opposite direction (e.g. a backward direction), and each exposure cycle comprises one or two exposure passes. In this way, exposure by the light source may be performed while moving in either one direction or both directions.

According to an exemplary embodiment the at least one first reciprocating movement comprises one or more front exposure steps during one or more front exposure periods, and the at least one second reciprocating movement comprises one or more back exposure steps during one or more back exposure periods, wherein the apparatus comprises an operator interface configured to receive at least one front characteristic representative for the one or more front exposure periods and/or at least one back characteristic representative for the one or more back exposure periods; and wherein the control means is configured for determining a sequence of operation for the light source based on the at least one first and/or second characteristic.

Preferably, both the front and the back characteristics can be changed by an operator and received through the operator interface. In this way, front exposure and back exposure may be customized at will. Alternatively one of the front or back characteristics is pre-set and the other one is variable and received through the operator interface. In this way, a predetermined number of scenarios may be provided to help the user prior to customization.

Preferably, the at least one back characteristic comprises any one of the following or a combination thereof: a speed value for the speed of the movement of the light source during the one or more back exposure steps, a number of times the same back exposure step is repeated, a duration of a back exposure period of said one or more back exposure periods, a value representative for a light intensity used during the one or more back exposure periods. Preferably, the at least one front characteristic comprises any one of the following or a combination thereof: a speed value for the speed of the movement of the light source during the one or more front exposure steps, a number of times the same front exposure step is repeated, a duration of a front exposure period of said one or more front exposure periods, a value representative for a light intensity used during the one or more front exposure periods.

In an exemplary embodiment, the sequence of operation comprises a back exposure step followed by one or more front exposure steps. This may result in an improved anchoring to the floor created by the back exposure step. In more advanced embodiment multiple back and front exposure steps may be performed one after the other, e.g. front/back/front/back or back/front/front/back, etc.

According to a preferred embodiment, the one or more front exposure steps comprise at least two front exposure steps. In this way, a front exposure may be distributed over at least two front exposure steps. Preferably the at least two front exposure steps comprise two different front exposure steps and the step of receiving comprises receiving a front characteristic for each different front exposure step. In this way, the front side of the relief precursor may be exposed sequentially under different conditions, in particular according to a plurality of cycles with stepwise increased or decreased intensities and/or speeds to improve the quality of the edges of the relief structures. For example, one or more cycles with a first intensity and speed may be followed by one or more cycles with a different intensity and/or speed. Alternatively, the at least two front exposure steps may be identical, to distribute exposure over time e.g. for thermal reasons (avoiding heat accumulating when exposing during a single cycle at a higher intensity and/or lower speed).

Preferably, the light source has an emitting area with a length to width ratio lower than 7, preferably between 3 and 7, more preferably lower than 5, even more preferably between 3 and 5. For example, when the light source comprises a carrier on which a plurality of LEDs is arranged, the surface area of the carrier in which the LEDs are arranged may have the above specified length to width ratio. Preferably, the carrier has a width which is smaller than 500 mm, e.g. between 100 mm and 400 mm, and a length between 1000 mm and 2000 mm.

Preferably, the moving means is configured so that the movement of the light source is not a circular movement around the object. Indeed, by using a reciprocating movement, it can be avoided that the same portion of the relief precursor is front-exposed and immediately afterwards back-exposed.

According to a preferred embodiment, the moving means is configured to perform a relative movement between the relief precursor and the light source along a direction perpendicular to the relief precursor plane, for example perpendicular to a transparent carrying plate for supporting the relief precursor. In that manner the distance between the light source and the relief precursor can be adjusted. It is noted that the light source may be moved and/or the carrying structure may be moved. Using such moving means, the homogeneity of the illumination in a desired plane can be further improved. For example, depending on the thickness of the relief precursor, the distance between the carrying structure and the light source may be adjusted.

According to a possible embodiment the carrying structure for supporting the relief precursor is configured to support the relief precursor so that a plane thereof is oriented vertically during an exposure by the light source. Such an embodiment has the advantage that the first and second side do not need to be supported and that the relief precursor can be suspended.

In an alternative embodiment, the carrying structure is configured to support the relief precursor so that it is oriented horizontally during exposure by the light source, wherein the carrying structure comprises an at least partially transparent support, such as a glass plate, a polymer plate, a transparent mesh, a set of rollers, a set of transparent tubes such as a set of light tubes. The back-exposure may then take place through the transparent portion of the support. Preferably, the carrying structure is a plate and the thickness of the carrying plate is between 2 mm and 20 mm. Preferably, the distance between the light source, when in the first or second position, and the carrying plate is between 10 mm and 100 mm. When the support is set of light tubes, the light tubes function both as support and for exposure, e.g. with a wavelength which is different from the wavelength of the light source. In other words, the support then forms an additional light source of the apparatus.

According to an exemplary embodiment, the moving means comprises any one of the group comprising an endless belt, a chain, a lead screw, a motor such as a linear motor, a piston, a toothed wheel such as a toothed wheel with cograil, a friction wheel, a gear, and combinations thereof.

In an exemplary embodiment the apparatus may comprise a housing with an entrance and exit, and optionally the relief precursor may be automatically fed through the entrance to a position on the carrying structure, exposed, and next removed from the apparatus through the exit. In other words, embodiments of the invention allow building a fully automated in-line system. The entrance and the exit may be at the same side or at opposite sides. The entrance and exit may be configured to be connected to other units.

The apparatus may comprise a transport system for automatic transport of the relief precursor into the apparatus in a transport direction, and optionally out of the apparatus. The transport system may comprise a transport means selected from the group comprising an endless belt, a pair of chains or belts (with pushing blocks), a pair of lead screws, a creep drive, a friction drive, and combinations thereof.

The direction of the first and second relative movement between relief precursor and light source may be perpendicular to the transport direction or parallel to the transport direction.

The transport system may further comprise at least one attachment means to attach the relief precursor to the transport means. The attachment means may be a transport bar with a plurality of pins extending through an edge of the relief precursor. Alternatively a clamping means for clamping the relief precursor may be used. The transport bar may be configured to be coupled to a leading edge of the relief precursor, wherein the transport system is configured to pull the transport bar with the coupled relief precursor through the housing. When the transport system comprises two lead screws, the end portions of the transport bar may be provided with dents adapted to be coupled to the lead screws.

In an exemplary embodiment the apparatus further comprises a cooling means configured to cool the relief plate precursor and/or the light source. For example, at least one cooling system may cool the light sources, the carrying structure (e.g. a transparent plate) and/or a surface of the relief precursor. The cooling means may use a fluid for cooling, e.g. water or air.

Additional components may be part of the apparatus. Such additional components may be selected from the group comprising a power source, an additional light source, a cooling system, a clamping means, an additional transport means, motors, sensors, and combinations thereof. The additional light source may be selected from the group comprising an LED, a fluorescent lamp, a flash lamp, a set of light tubes arranged in a linear fashion, a (scanning) laser, an LCD screen, a projection system (e.g. with movable mirrors), lasers and combinations thereof (these may be stationary and/or movable). The additional light source may be capable of irradiating at least a partial area, preferably the whole area of one or both surfaces of the relief precursor. The additional light source may be arranged so that the light source can move between the additional light source and the relief precursor. Optionally, there may be provided an additional light source on either side of the relief precursor. The additional light source may be controlled to expose the relief precursor before, during or after the exposure by the light source.

Optionally, the control means controls components of the apparatus as well as components of other units in a process chain. In that manner the various operations that need to be performed on the relief precursor may be coordinated. The control means may be a single centralized controller, or a distributed control means with multiple control modules.

Optionally one or more sensors, such as light sensors, magnetic sensors, proximity sensors, temperature sensors, overheating sensors, flow sensors, intensity sensors, pressure sensors, thickness sensors etc., may be provided. The movement of the light source and the driving of the light source may then be further controlled in function of the sensor data measured by the one or more sensors. A sensor of the one or more sensors may be capable of detecting the size and/or thickness of the relief precursor and these data may be used to control e.g. the size of the exposed area and/or the light intensity.

Optionally, the apparatus may comprise one or more additional treatment units selected from the group comprising loading and unloading units, an imaging unit, a liquid development unit, a thermal development unit, a drying unit, a post-treatment unit, a pre-treatment unit, a storage unit and combinations thereof.

According to a further aspect of the invention there is provided a method for exposing a relief precursor comprising at least one photosensitive layer. The method comprises the following steps:
  providing a relief precursor,
  optionally performing a pre-exposure with an additional light source,
  performing a first relative movement between the light source and the relief precursor whilst exposing a first side of the relief precursor,
  moving the light source from a first position facing the first side to a second position facing a second side of the relief precursor;
  performing a second relative movement between the light source and the relief precursor whilst exposing the second side of the relief precursor, and wherein at least one of the first and the second relative movement is a reciprocating movement.

According to an exemplary embodiment, the light source has an emitting side and a non-emitting side and the moving step comprises rotating the light source, preferably 180°, when moving the light source from the first position in which the emitting side faces the first side of the relief precursor to the second position in which the emitting side faces the second side of the relief precursor.

The first and second relative movement may be oriented in a direction parallel to the plane of the relief precursor.

According to an exemplary embodiment, the method further comprises:
controlling the performing of a first relative movement means so that at least one first reciprocating movement is performed to expose the first side of the relief precursor;
controlling the performing of a second relative movement means so that at least one second reciprocating movement is performed to expose the second side of the relief precursor.

According to an exemplary embodiment, the method further comprises controlling the light source such that exposure of the first side takes place during a forward and/or backward trajectory of the first reciprocating movement, and such that exposure of the second side takes place during a forward and/or backward trajectory of the second reciprocating movement.

According to an exemplary embodiment, the method further comprises, after performing of the second relative movement, moving the light source from the second position back to the first position.

According to an exemplary embodiment, the method further comprises adjusting the intensity of the light source so that the intensity used during the first relative movement is different from the intensity used during the second relative movement.

According to an exemplary embodiment, the method further comprises performing a relative movement between relief precursor and the light source along a direction perpendicular to the relief precursor plane.

According to an exemplary embodiment, the intensity distribution of the light output by the light source may be varied during the movement. For example, the intensity of the light output may be different for forward and backward movement and/or may be different in different reciprocation cycles. Also, the intensity of the light output may be varied over time.

Preferably, the relief precursor is a precursor for an element selected from the group comprising a flexographic printing plate, a relief printing plate, a letter press plate, an intaglio plate, a (flexible) printed circuit board, an electronic element, a microfluidic element, a micro reactor, a phoretic cell, a photonic crystal and an optical element, a Fresnel lens.

Preferably, the light source is selected from the group comprising an LED array, a set of light tubes, an LCD screen, one or more flash lamps, one or more fluorescent lamps, one or more lasers, a projection system (with movable mirrors), and combinations thereof.

Optionally a pre-exposure may be performed using a light source selected from the group comprising an LED, a fluorescent lamp, a flash lamp, a set of light tubes arranged in a linear fashion, a (scanning) laser, an LCD screen, a light projection system (with movable mirrors), and combinations thereof. During the pre-exposure step a layer of the relief precursor may be altered in an image forming fashion.

Optionally, the method comprises one or more further steps selected from the group of removal of uncured material, washing, drying, heating, post exposure, grinding, and combinations thereof.

BRIEF DESCRIPTION OF THE FIGURES

The accompanying drawings are used to illustrate presently preferred non limiting exemplary embodiments of the apparatus and method of the present invention. The above and other advantages of the features and objects of the invention will become more apparent and the invention will be better understood from the following detailed description when read in conjunction with the accompanying drawings, in which.

DETAILED DESCRIPTION OF EMBODIMENTS

Figure 1:
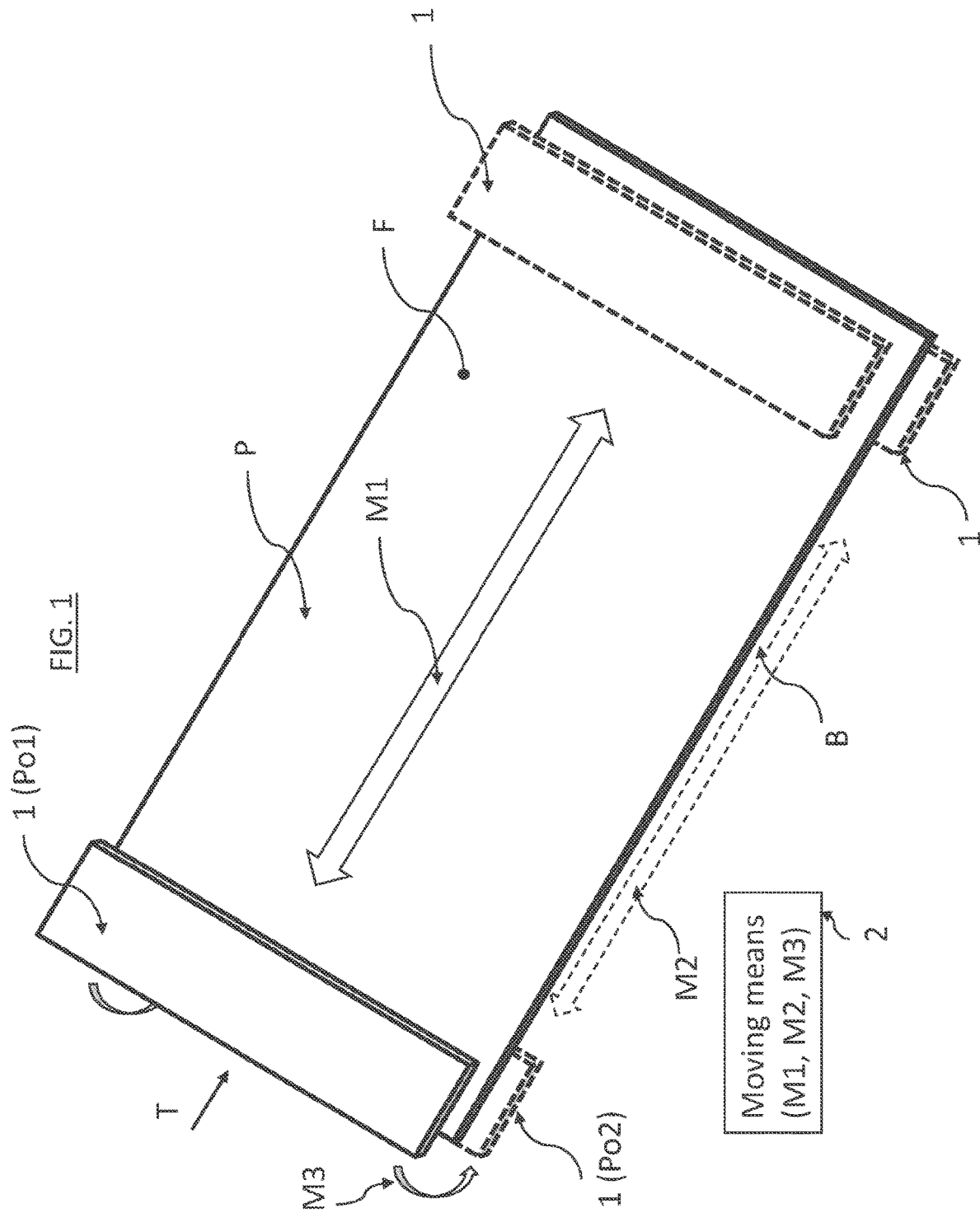
FIG. 1 is a schematic perspective view of an exemplary embodiment of an apparatus for exposure of a relief precursor.

FIG. 1 schematically illustrates an apparatus for exposure of a relief precursor P which comprises a substrate layer and at least one photosensitive layer. The apparatus comprises a light source 1, a moving means 2, and a carrying structure (not shown) for supporting the relief precursor P.

The light source 1 is a substantially planar light source configured to expose the relief precursor during relative movement between the light source and the relief plate precursor P. The moving means 2 is configured
to cause a first relative movement M1 between the light source 1 and the relief precursor P to expose the first side F of the relief precursor; during this first relative movement M1 the light source 1 and/or the relief precursor P may be moved. The light source is located at the first side F of the relief precursor P, see position Po1;

to move M3 the light source 1 between the first position Po1 and a second position Po2, said first and second positions being on opposite sides of a plane of the relief precursor P; and to cause a second relative movement M2 between the light source 1 and the relief precursor P to expose the second side of the relief precursor; during this second relative movement M2 the light source 1 and/or the relief precursor P may be moved. The light source is located at the second side B of the relief precursor P, see position Po2.

Preferably, the first and the second relative movement M1, M2 are reciprocating movements.

Figure 2:
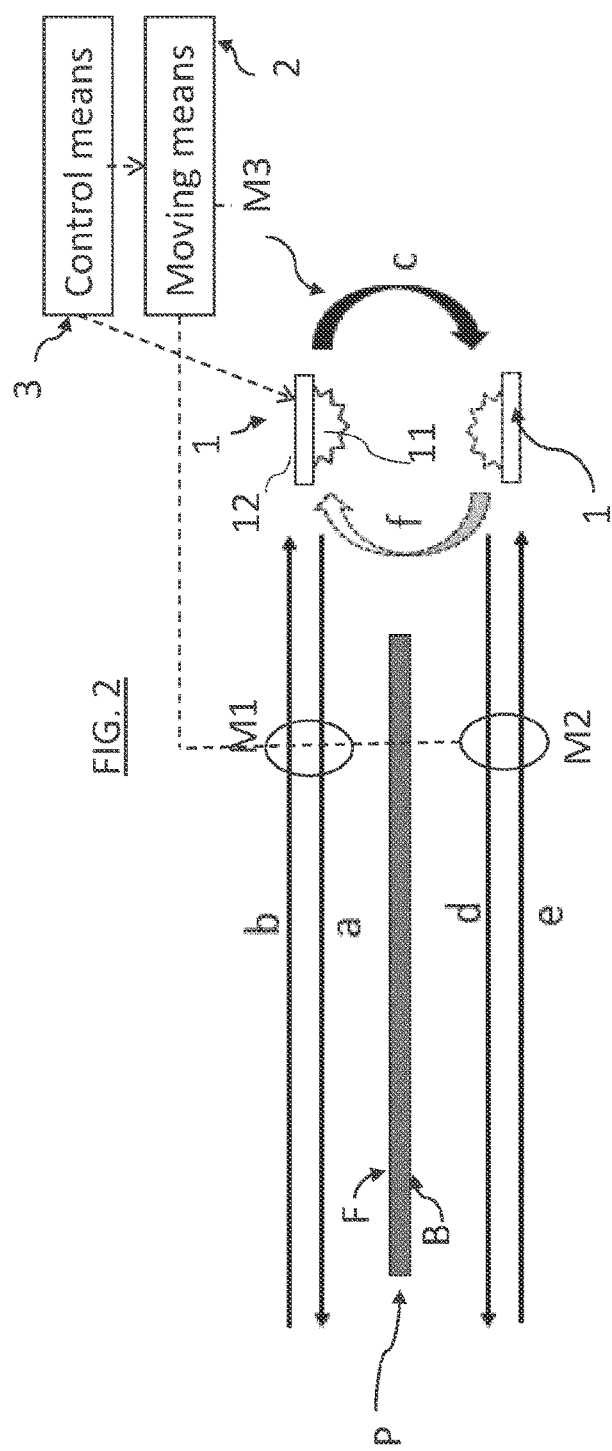
FIGS. 2 and 3 illustrate schematically the operation of the apparatus for an exemplary embodiment where the light source is moved during exposure and for an exemplary embodiment where the relief precursor is moved during exposure, respectively.
Figure 3:
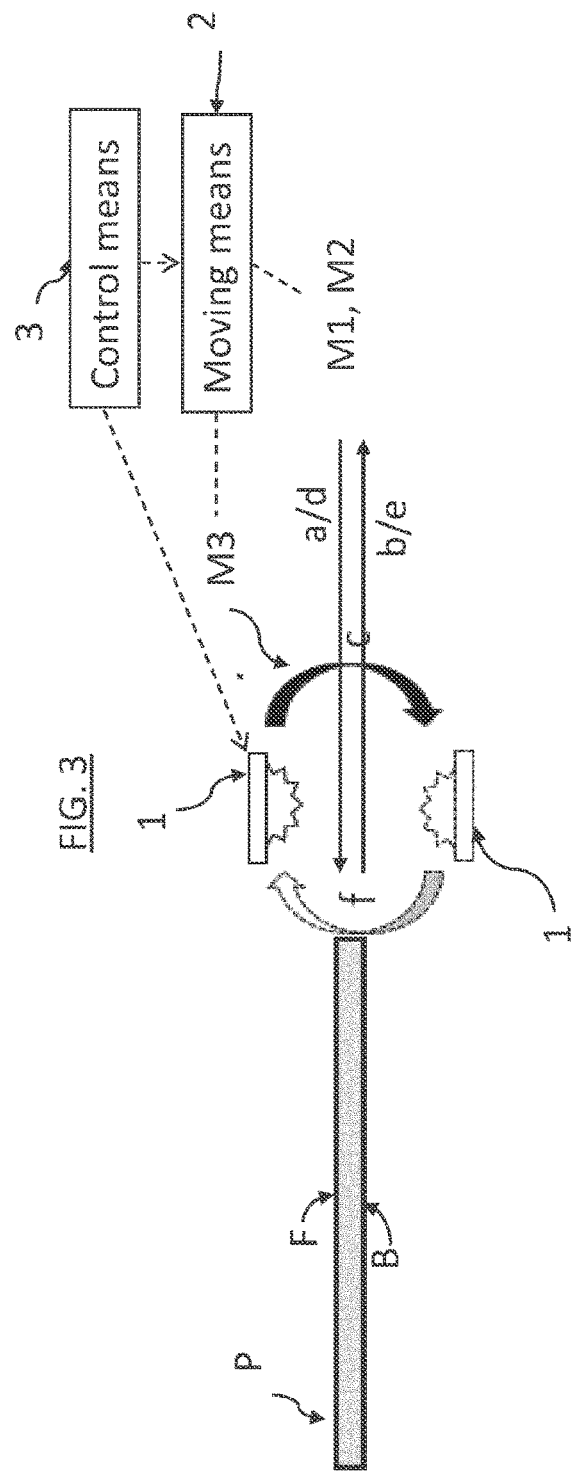

FIG. 2 illustrates an option where the light source 1 is moved to cause the relative movement M1, M2 and FIG. 3 illustrates an embodiment where the relief precursor P is moved to cause the relative movement M1, M3. The skilled person understands that it is also possible to move both the light source 1 and the relief precursor P.

The light source 1 has an emitting side 11 and a non-emitting side 12 and the moving means 2 is configured to rotate the light source 180°, when moving the light source 1 between the first position Po1 in which the emitting side 11 faces the first side F of the relief precursor P and the second position Po2 in which the emitting side 11 faces a second side B of the relief precursor P. The light source 1 substantially extends in a plane parallel to the relief precursor P, and the first and second relative movements M1, M2 are in a direction parallel to the plane of the relief precursor P.

As illustrated in FIGS. 2 and 3, preferably the apparatus comprises a control means 3 configured to control the movement means 2 and/or the light source 1. The control means 3 is configured to control the movement means 2 to perform consecutively:

at least one first reciprocating movement (M1; see arrows a, b) to expose the first side F of the relief precursor;

a movement (M3; see arrow c) from the first position to the second position;

at least one second reciprocating movement (M2; see arrows d, e) to expose the second side of the relief precursor;

a movement (M3; see arrow f) from the second position to the first position.

These consecutive steps may be repeated a number of times.

The control means 3 may be configured to control the light source such that exposure of the first side F takes place during a forward trajectory a and/or backward trajectory b of the first reciprocating movement M1, and such that exposure of the second side B takes place during a forward trajectory d and/or backward trajectory e of the second reciprocating movement M2. More in particular, the control means 3 may configured to adjust the intensity of the light emitted by the light source 1 so that the intensity during the first relative movement M1 is different from the intensity during the second relative movement M2. Also, the control means 3 may be configured to adjust the speed of the first and second relative movement during the trajectories a, b, d, e. In that manner, the front and back exposure can be well controlled using only a single light source 1.

The light source 1 may be selected from the group comprising: a plurality of LEDs, a set of fluorescent lamps, a flash lamp, a set of light tubes, an LCD screen, a light projection system (with movable mirrors), a sun light collection system, and combinations thereof.

Preferably, the light source 1 is configured to illuminate an illumination area of a plane in which the relief precursor is intended to be located. The term illumination area of a plane is defined by the area where the intensity is higher than 10% of a maximum value of the light intensity in said plane. When a horizontal carrying structure is present, the plane may correspond with a support surface of the carrying structure. The carrying structure may be e.g. a glass plate configured for supporting the relief precursor. Preferably, the carrying structure is a plate with a thickness between 0.5 and 20 mm (more preferably between 1 and 15 mm). Preferably, the distance between the light source 1 and the carrying structure is between 10 mm and 150 mm, e.g. between 20 mm and 100 mm. Preferably, the thickness of the relief precursor P is between 0.5 mm and 10 mm (more preferably between 1 and 7 mm).

Preferably, the light source 1 has an emitting area with a length to width ratio lower than 7, preferably between 3 and 7, more preferably lower than 5, even more preferably between 3 and 5.

In a preferred embodiment the light source 1 may comprise one or more carriers on which a plurality of light emitting elements are arranged, and the carrier may be oriented parallel to the relief precursor P. For example, the light source comprises one or more printed circuit boards (PCBs), on which a LED array is arranged. Preferably, the irradiation intensity delivered by the LEDs in a predetermined surface area is in the range of 0.1 to 2000 mW/cm2. For back exposure (during relative movement M2), preferably the irradiation intensity delivered by the LEDs in a predetermined surface area is between 5 and 100 mW/cm2, more preferably between 8 and 60 mW/cm2, most preferably between and 50 mW/cm2. For front exposure (during relative movement M1), preferably the irradiation intensity delivered by the LEDs in a predetermined surface area is between 30 and 500 mW/cm2, more preferably between 50 and 450 mW/cm2, most preferably higher than 100 mW/cm2. Preferably, the distance between the LED array and the predetermined surface area is at least 35 mm. The predetermined surface area may be a surface area in the relief precursor when arranged in the apparatus or at a small distance of the relief precursor, e.g. a plane of the carrying structure. To that end, the moving means 2 preferably allow to adjust the distance between the light source and the relief precursor seen in a direction perpendicular on the relief precursor.

Preferably, the light source 1 is an array of LEDs comprising a plurality of subsets of one or more LEDs, each subset being individually controllable, as explained in more detail in the summary above.

Figure 4:
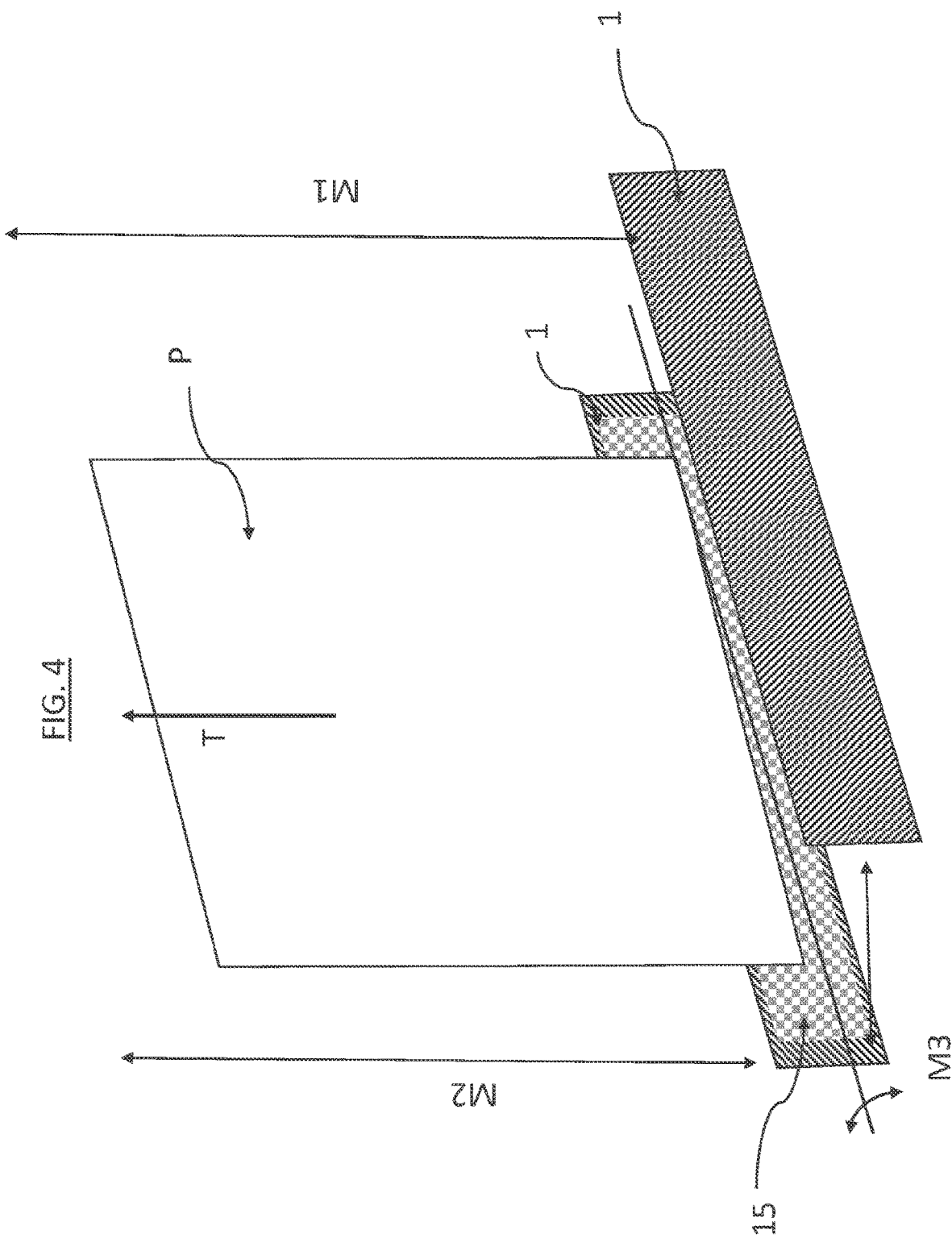
FIGS. 4 and 5 are schematic perspective views of two further exemplary embodiments of an apparatus for exposure of a relief precursor.
Figure 5:
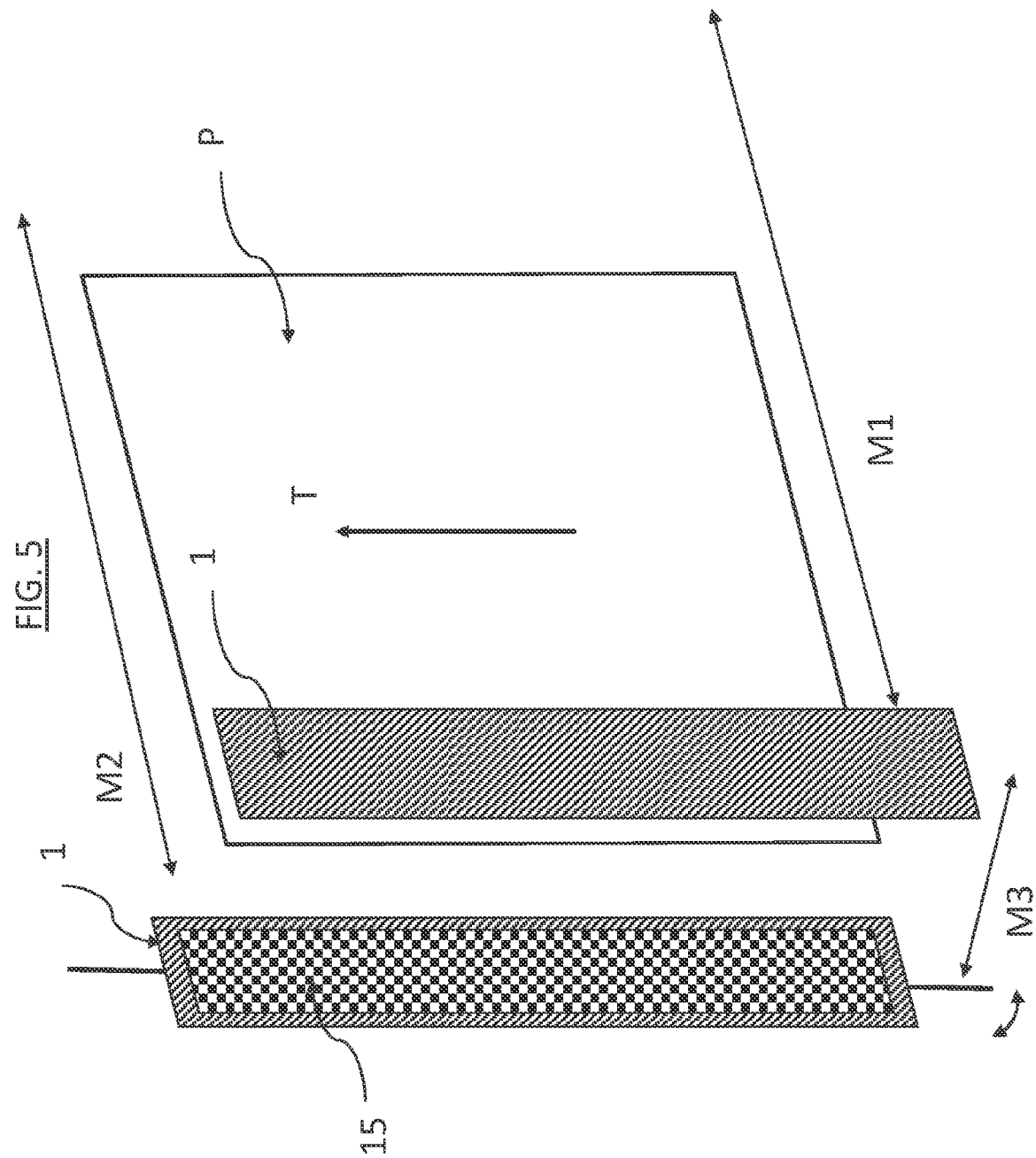

FIGS. 4 and 5 show two alternative embodiments in which the same or similar parts have been indicated with the same reference numerals. The operation of the light source, moving means and control means may be the same as or similar to the operation described above for the embodiments of FIGS. 1-3, with this difference that in FIGS. 4 and 5 the apparatus comprises a carrying structure (not shown) configured to support the relief precursor P so that a plane thereof is oriented vertically during an exposure by the light source 1.

The direction of the first and second relative movement M1, M2 between relief precursor and light source may be perpendicular to the transport direction T of the relief precursor P through the apparatus, as illustrated in FIG. 4, or may be parallel to the transport direction T of the relief precursor P, as illustrated in FIG. 5.

Preferably, the light source 1 has an emitting area 15 with a length to width ratio lower than 7, more preferably lower than 5, even more preferably between 3 and 5 (note that FIGS. 1-5 are not drawn to scale and the emitting area 15 in FIGS. 4 and 5 is only for illustrative purposes). In an embodiment where the light source 1 comprises a LED array, this emitting area 15 may correspond with the area in which the LED array is located.

Figure 6:
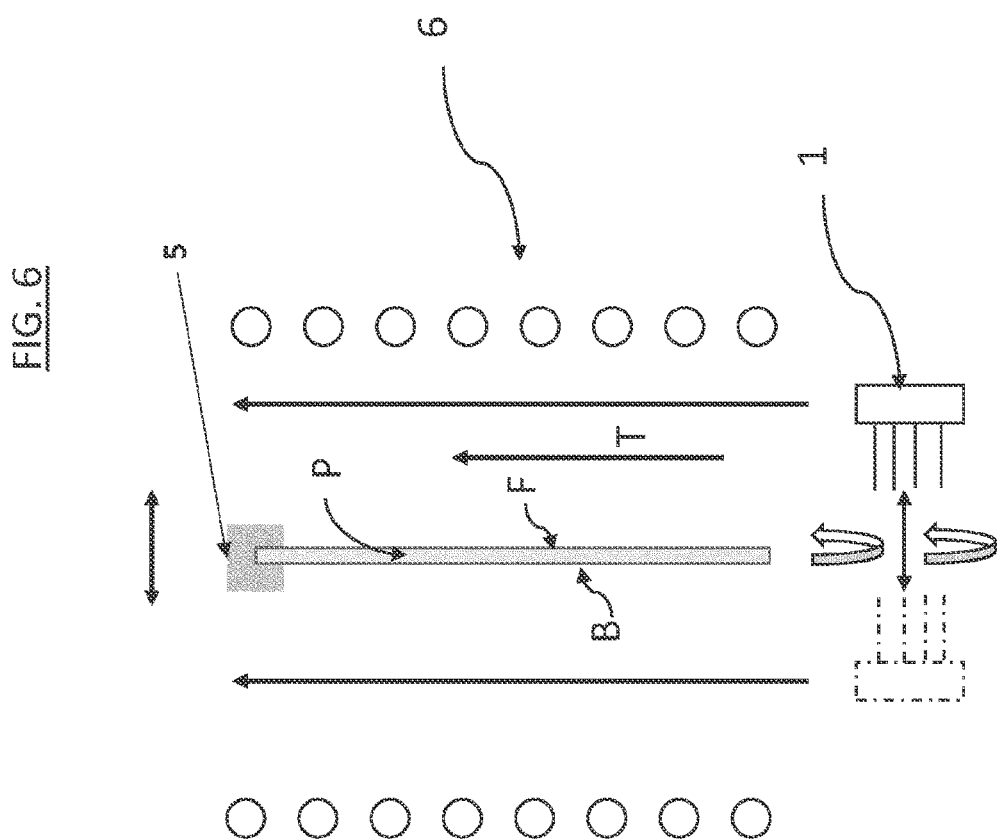
FIG. 6 is a perspective sectional view of another exemplary embodiment of an apparatus for exposure of a relief precursor.

FIG. 6 illustrates a further embodiment of an apparatus for exposure of a relief precursor P in which the same or similar parts have been indicated with the same reference numerals. In this embodiment a light source 1 as illustrated in FIG. 4 or 5 is combined with an additional light source 6, here a set of light tubes. In other embodiments the additional light source may be a LED array. As illustrated in FIG. 6, the additional light source 6 may be arranged on both sides of the relief precursor P, and such that the light source 1 can be moved in between the relief precursor P and the additional light source 6. In other embodiments, the additional light source 6 may be arranged at only one side of the relief precursor P. Also, the additional light source could be arranged upstream or downstream of the operational area of the light source 1, as seen in the transport direction T.

In the embodiment of FIG. 6, the additional light source 6 may be operated before, during or after the operation of the light source 1. For example, the additional light source 6 may perform a back exposure whilst the light source 1 is being moved along the back or the front side to perform a simultaneous exposure by light source 1. Alternatively, first a front and/or back exposure is done with the additional light source 6, whereupon a front and/or back exposure may be done with the light source 1, or first a front and/or back exposure may be done with the light source 1 followed by a front and/or back exposure with the additional light source 6, or first a front exposure is done with light source 1, followed by a back exposure with light source 6, followed by a further back exposure with light source 1. More generally, the skilled person understands that any order may be used depending on the desired application, and that the light sources 1 and 6 may be activated simultaneously or consecutively.

FIG. 6 further illustrates that the relief precursor P may be pulled through the apparatus in a direction T by means of an attachment means 5 coupled to a leading edge of the relief precursor P.

Figure 7:
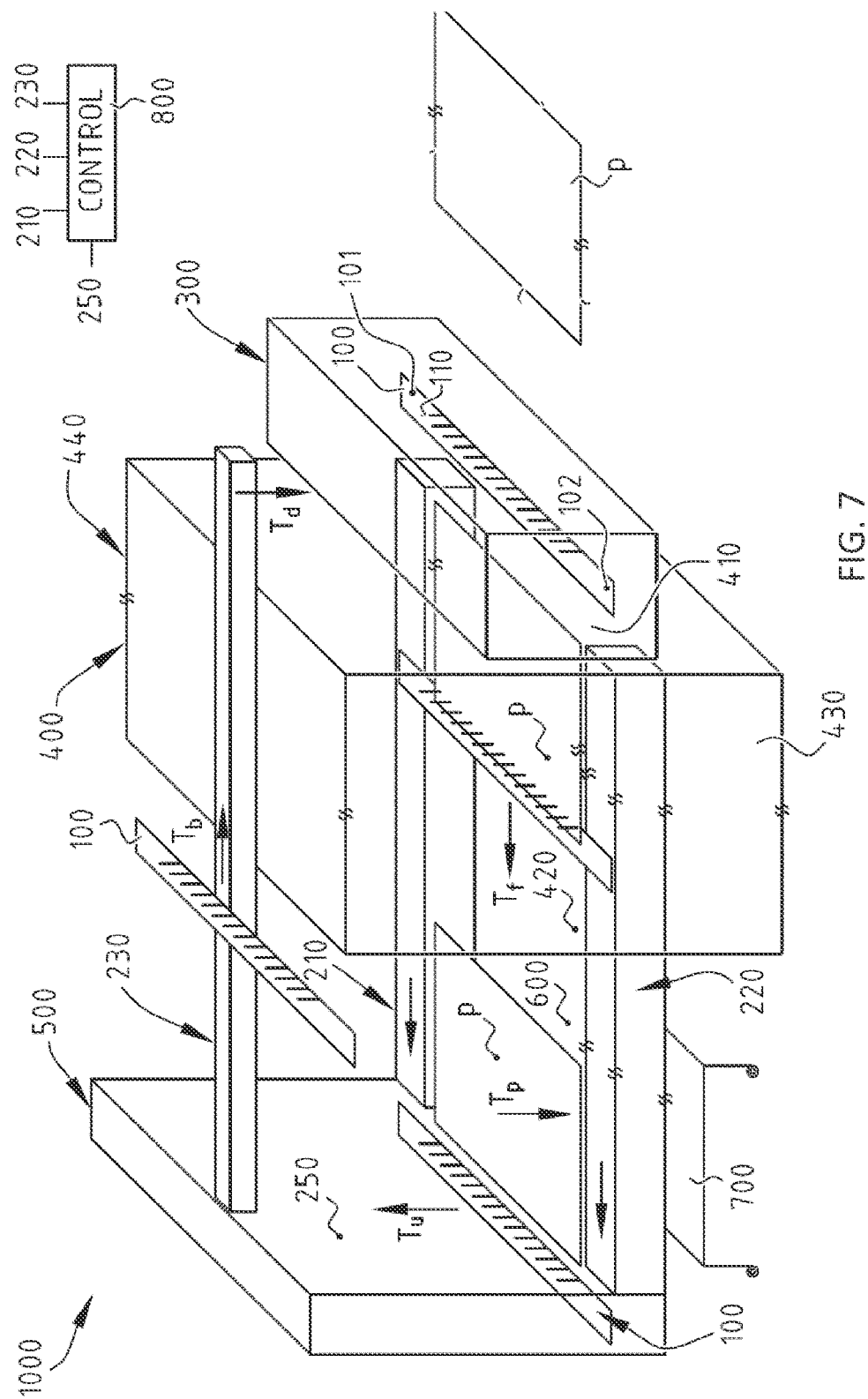
FIG. 7 illustrates a schematic perspective view of a further developed exemplary embodiment of an apparatus for treatment of a relief precursor.

FIG. 7 illustrates a further developed implementation of such an attachment means 5 in the form of a transport bar 100.

FIG. 7 illustrates schematically an apparatus 1000 for exposing a relief precursor, such as a printing plate precursor P. However, the apparatus 1000 may also perform other additional treatments such as brushing, rinsing, spraying, drying, developing, heating, cooling, removing of material of the relief precursor, treating the relief precursor with gases or liquids, sanding the relief precursor, cutting the relief precursor, treating it with electromagnetic waves, or combinations thereof.

The apparatus 1000 comprises a transport system 210, 220, 230 with at least one, preferably at least two, and even more preferably at least three transport bars 100 intended to be coupled to a relief precursor. For example, four transport bars 100 may be provided to the transport system 210, 220, 230 as illustrated in FIG. 7. The transport bar 100 is coupled to a leading edge of the relief precursor P and preferably extends over more than the entire length of the leading edge, such that end parts of the transport bar 100 can be coupled to a transport mechanism of the transport system 210, 220, see further. It is noted that it is also possible to couple a plurality of relief precursors to the transport bar 100. Preferably, the length of the transport bar 100 is between 100 mm and 1000 mm, more preferably between 1000 mm and 4000 mm.

The apparatus 1000 comprises a plate coupling station 300 configured for coupling a relief precursor P to a transport bar 100, an exposure compartment 400 configured for exposing the relief precursor whilst the transport bar 100 to which the relief precursor P is coupled, is moved through the exposure compartment 400, and a plate decoupling station 500 configured for decoupling the treated relief precursor P from the transport bar 100. It is noted that one or more further treatment compartments may be provided between the exposure compartment 400 and the plate decoupling station 500 and/or between the exposure compartment 400 and the plate coupling station 300. Preferably, the transport system 210, 220, 230 is configured to automatically move each transport bar 100, after being coupled to a relief precursor P in the plate coupling station 300, from the plate coupling station 300 through the exposure station 400 to the plate decoupling station 500, and, after being decoupled from a treated relief precursor P, from the plate decoupling station 500 back to the plate coupling station 300, such that the transport bar 100 moves in a closed loop through the apparatus 1000. In the illustrated example of FIG. 7, four transport bars 100 circulate in the apparatus 1000. However, the invention also cover embodiments where the transport bars are brought back manually from the plate decoupling station 500 to the plate coupling station 300.

In a preferred embodiment, each transport bar 100 is provided with a plurality of penetration elements 110 (here in the form of pins or rods), and the plate coupling station 300 is configured to engage the plurality of penetration elements 110 in an area near the leading edge 3 of the relief precursor P. In FIG. 7, the relief precursor P has a leading edge and a trailing edge, both perpendicular to a forward transport direction Tf of the relief precursor P through the apparatus 1000. An area near the leading edge of the relief precursor P is coupled to the plurality of penetration elements 110 of the transport bar 100. A detailed description of an embodiment of a transport bar is given in WO2019206911A1 in the name of the applicant, which in included herein by reference. The plurality of penetration elements 110 preferably have sharp tips, and the plate coupling station 300 is preferably configured to cause a penetration of the plurality of penetration elements 110 at least partially into or through an unperforated area near the leading edge 3 of the relief precursor P. However, it is noted that according to another exemplary embodiment, the apparatus 1000 of FIG. 7 may also be used with transport bars 100 which are provided with a plurality of penetration elements 110 which do not have a sharp tip. For example, the area near the leading edge 3 of the relief precursor P may be pre-perforated before bringing the relief precursor P to the plate coupling station 300, such that the plurality of penetration elements 110 can be arranged through pre-perforated holes in the area near the leading edge 3.

The exposure compartment 400 has an inlet side 410 and an outlet side 420. A transport bar 100 with a coupled relief precursor P is moved through the exposure compartment 400 from the inlet side 410 to the outlet side 420, wherein the transport bar 100 moves in the forward transport direction Tf. Between the outlet side 420 of the exposure compartment 400 and the plate decoupling station 500, there is provided a plate discharge zone 600. A relief precursor P is pulled by the transport system fully out of the exposure compartment 400, optionally passes through additional treatment compartments (not shown), to end in the plate discharge zone 600 before being decoupled from the transport bar 100 in the decoupling station 500. In that way, when the relief precursor P is decoupled from the transport bar 100, the relief precursor P can be discharged in the plate discharge zone 600. At the bottom of the plate discharge zone 600 there may be provided a removal means configured to remove a treated relief precursor P after being decoupled from the transport bar 100 in the plate decoupling station 500. In the illustrated embodiment, the removal means 700 is a trolley configured for receiving the treated relief precursor P in the plate discharge zone 600, and for being moved out of the plate discharge zone 600, such that it can be easily transported away of the plate discharge zone. In other non-illustrated embodiments, the removal means 700 may be a carrier, a robot, a moving belt, at least one rotating drum, etc. Also such devices can be configured to move a treated relief precursor P out of the plate discharge zone 600 after being decoupled in the plate decoupling station 500.

In the embodiment of FIG. 7, the transport system comprises a forward transport mechanism which comprises first transport mechanism 210 on one side of the apparatus 1000, and a second transport mechanism 220 on the other side of the apparatus 1000. The transport mechanism 210, 220 is configured to transport the transport bar 100 with a coupled relief precursor P at least from the inlet side 410 to the outlet side 420 of the exposure compartment 400, and optionally from the outlet side 420 to the plate decoupling station 500, in the forward transport direction Tf. To that end, a first outer end 101 of the transport bar 100 is coupled with the first forward transport mechanism 210, and a second outer end 102 of the transport bar 100 is coupled with the second forward transport mechanism 220. The transport system 210 may comprise a bar coupling means configured to couple the transport bar 100, and more in particular the first outer end 101 and the second outer end 102 of the transport bar to the first and second forward transport mechanism 210, 220. The exposure compartment 400 has a first and second opposite lateral side 430, 440 extending in the forward transport direction Tf, and the first and second forward transport mechanism 210, 220 extend at the first and second opposite lateral side 430, 440 of the exposure compartment 400, respectively.

The transport system further comprises a backward transport mechanism 230 configured to transport the transport bar 100 from the plate decoupling station 500 back to the plate coupling station 300. In the illustrated embodiment of FIG. 7, the backward transport mechanism 230 is located at an upper side of the apparatus 1000. However, in other embodiments, the backward transport mechanism 230 could be arranged in a lower portion of the apparatus 1000, below the forward transport mechanism 210, 220. A backward transport mechanism 230 may comprise any one of the following: one or more belts, one or more chains, one or more lead screws, a linear motor, or combinations thereof. In FIG. 7, the backward transport mechanism 230 is arranged centrally above the exposure compartment 400. However, the backward transport mechanism 230 could also be realized with a first and second backward transport mechanism located at opposite lateral sides of the exposure compartment 400 above or below the first and second forward transport mechanism 210, 220. Alternatively, the backward transport mechanism may be located at a lateral side of the exposure compartment, and optionally the transport bar may be rotated and transported backward in a vertical position. However, in order to reduce the footprint of the apparatus the backward transport mechanism is preferably located above or below the first and second forward transport mechanism 210, 220. As illustrated in FIG. 7, the backward transport mechanism 230 is located partly above the exposure compartment 400, and the transport system further comprises an upward transport mechanism 250 configured to move a decoupled transport bar 100 in the plate decoupling station 500 upward towards the backward transport mechanism 230. For example, the upward transport mechanism 250 may move the transport bar 100 in an upward direction Tu, typically a vertical direction, towards the backward transport mechanism 230 which moves the transport bar 100 in a backward transport direction Tb opposite to the forward transport direction Tf, back to the plate coupling station 300. The upward transport mechanism 250 may comprise any one or more of the following: magnetic means, electromagnetic means, clamping means, vacuum means, linear motors, chains, belts, lead screws, piston or combinations thereof. In other embodiments where the backward transport mechanism 230 is located below the forward transport mechanism, there may be provided a downward transport mechanism. The downward transport mechanism may comprise any one or more of the following: magnetic means, electromagnetic means, clamping means, vacuum means, linear motors, chains, belts, lead screws, piston or combinations thereof, or occur simply by gravity.

The transport system 210 is controlled, e.g. using a control means 800 as illustrated in FIG. 7, such that the transport bar 100 with the coupled relief plate precursor is moved through the exposure compartment 400 where the relief plate precursor is exposed.

The exposure compartment 400 may be configured with a light source 1 and a moving means 2 as described above in connection with FIGS. 1-6. The control means 800 may also include the control means 3 for controlling the light source 1 and/or the moving means 2.

Figure 8:
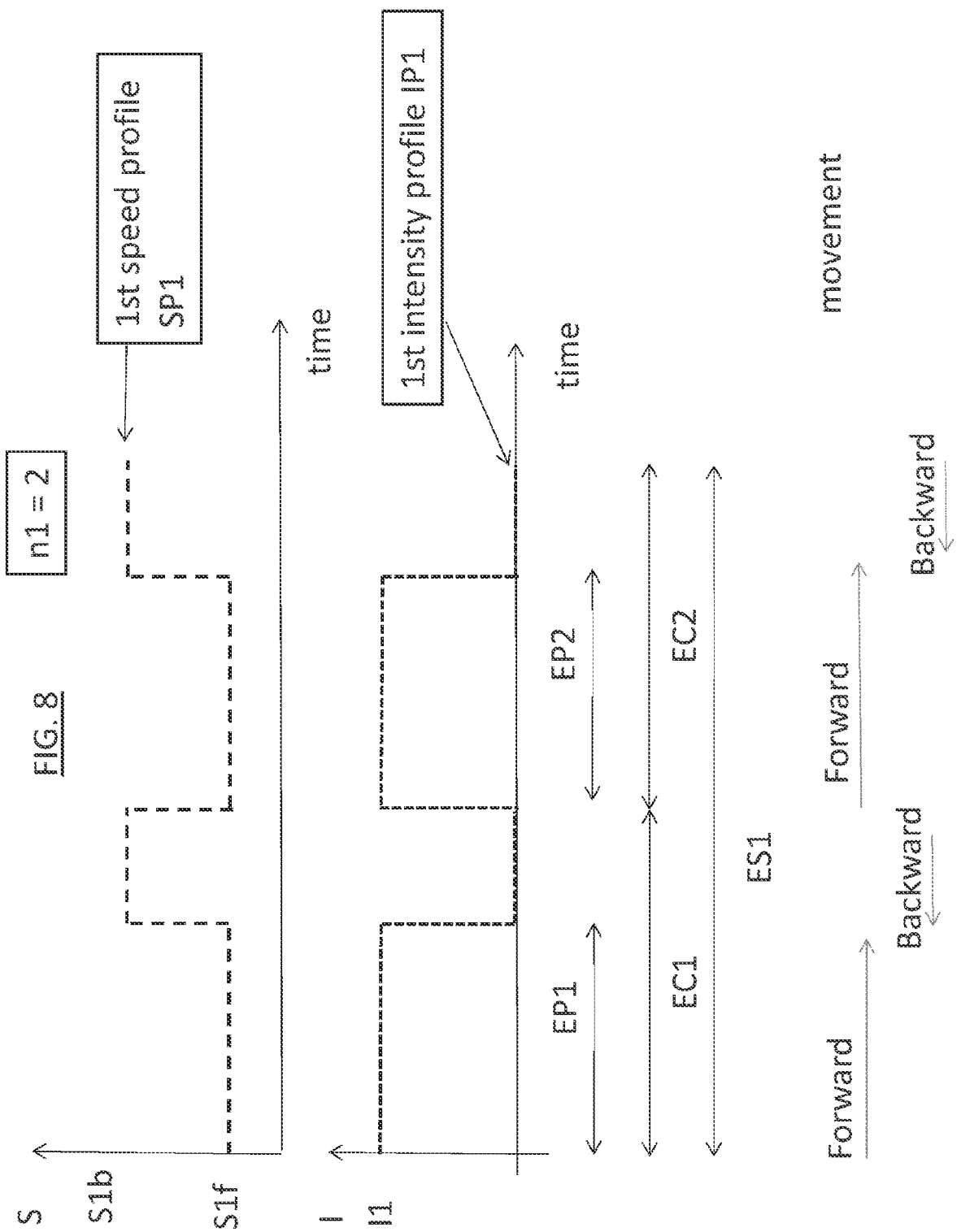
FIG. 8 is a time diagram of the first exposing step of an exemplary embodiment of a method for exposure of a relief precursor cursor in a case where the light source exposes only during a forward movement.

FIG. 8 is a time diagram of the first exposing step of an exemplary embodiment of a method for exposure of a relief precursor cursor in a case where the light source exposes only during a forward movement. The light source is moved in exposure cycles with a first movement in a first direction and a second movement in a second opposite direction. Each exposure cycle may comprise one exposure pass and one time period for bringing the light source back into its original position. Such method may be used for the at least one first reciprocating movement (M1; a, b) for the front exposure which has been described above in connection with FIGS. 1-6. In addition or alternatively, such method may also be used for the at least one second reciprocating movement (M2; d, e) for the back exposure.

FIG. 8 shows as an example a first exposing step ES1 comprising two cycles EC1 and EC2. During each cycle EC1, EC2, the light source may expose the relief precursor during an exposure pass EP1, EP2 while during the rest of the cycles the light source is brought back into its original position for the next cycle.

During the first exposing step ES1, the intensity I of the light source is controlled to follow a first intensity profile IP1. The first intensity profile IP1 is such that, during the exposure passes EP1 and EP2, the intensity is substantially constant and equal to an average intensity I1 and during the rest of the cycles EC1 and EC2 substantially zero. Yet, depending on circumstances, other options could be envisaged where the first intensity profile IP1 would follow a profile increasing or decreasing with time during each pass of the first exposing step or between subsequent passes of the first exposing step. A stepwise or linear increase of intensity between passes of the first exposing step could also be envisaged.

During the first exposing step ES1, the speed of the moving means moving the light source is controlled to follow a first speed profile SP1. The first speed profile SP1 is such that during the exposures passes EP1 and EP2 the speed is substantially constant and substantially equal to an average speed S1$f$ for forward movement during the first exposing step while, during the rest of the cycles EC1 and EC2, the speed is substantially equal to an average speed S1$b$ for backward movement during the first exposing step. The backward speed S1$b$ is typically higher that the forward speed Sf to keep the duration of the backward movement as small as possible. Yet, depending on circumstances, other options could be envisaged where the first speed profile SP1 would follow a profile increasing or decreasing with time during each pass of the first exposing step or between subsequent passes of the first exposing step. A stepwise or linear increase of speed between passes of the first exposing step could also be envisaged. Additionally both speed and intensity could have a profile that could be customized according to circumstances.

Figure 9:
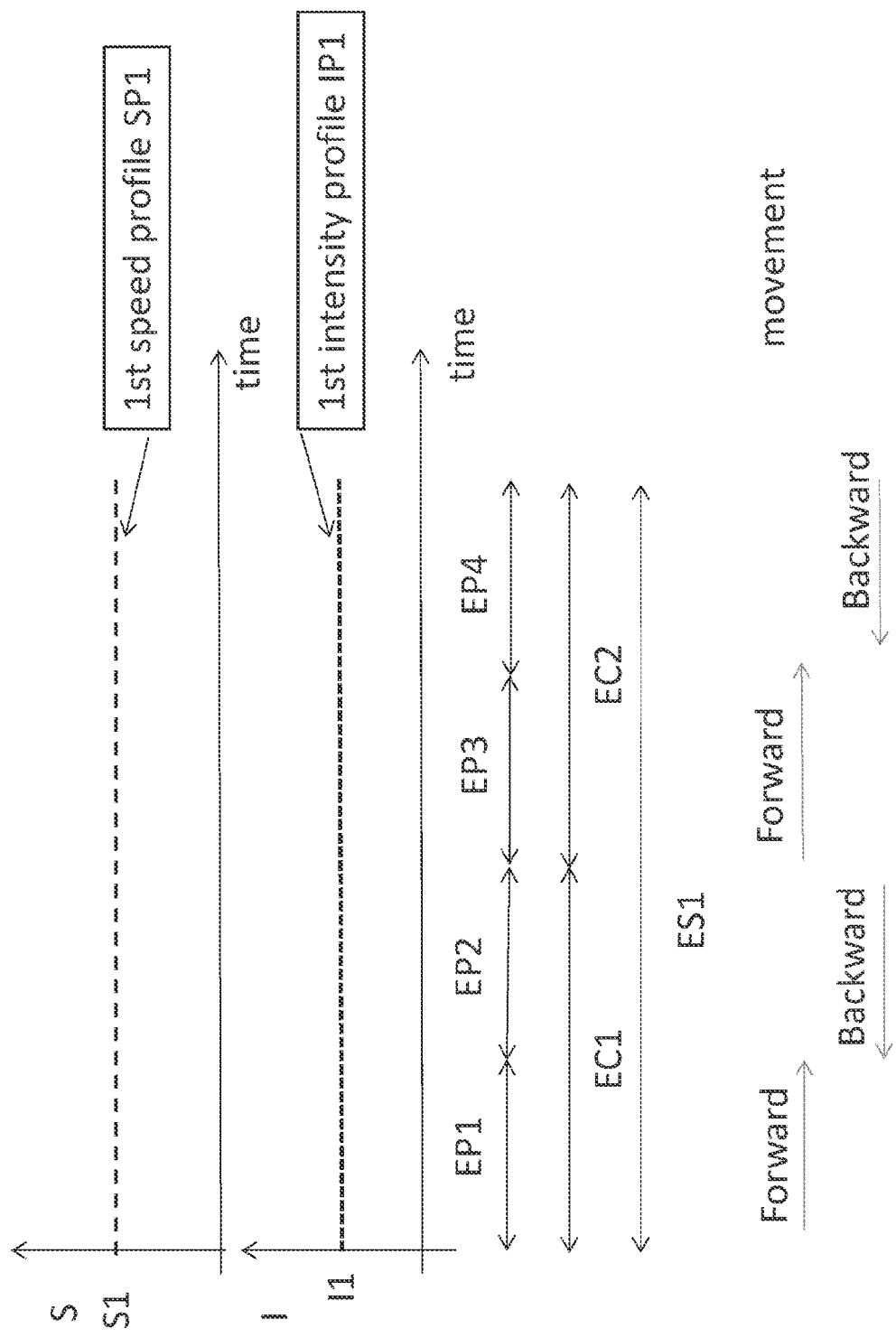
FIG. 9 is a time diagram of the first exposing step of an exemplary embodiment of a method for exposure of a relief precursor cursor in a case where the light source exposes during the whole cycle of forward and backward movement.

FIG. 9 is a time diagram of the first exposing step of an exemplary embodiment of a method for exposure of a relief precursor cursor in a case where the light source exposes during the whole cycle of forward and backward movement. Such method may be used for the at least one first reciprocating movement (M1; a, b) for the front exposure which has been described above in connection with FIGS. 1-6. In addition or alternatively, such method may also be used for the at least one second reciprocating movement (M2; d, e) for the back exposure.

In FIG. 9, the first exposing step ES1 comprises also two cycles EC1 and EC2. Yet contrary to the embodiment of FIG. 8, in FIG. 9, the light source may expose the relief precursor during a whole exposure cycle, meaning during both forward and backward movement of the light source. Each cycle comprises in that case two exposure passes. For instance the cycle EC1 comprises the exposure passes EP1 and EP2, while the exposure cycle EC2 comprises the exposure passes EP3 and EP4, where during EP1 and EP3 the light source is moved in the same (forward) direction whereas during EP2 and EP3 the light source is moved in the opposite (backward) direction.

During the whole first exposing step ES1, the intensity I of the light source is controlled to follow a first intensity profile IP1 being a substantially constant average intensity I1. Similarly, during the whole first exposing step ES1, the speed of the moving means moving the light source is controlled to follow a first speed profile SP1 being a substantially constant average speed S1 for both forward and backward movement.

Additionally, like for the embodiment of FIG. 8, other options than constant profiles could be envisaged for the intensity profile or the speed profile or both depending on circumstances to customize the first exposing step to the needs of the operator. For instance the average speed and/or average intensity during the passes of the first exposing step could be increased stepwise after a certain number of passes.

Figure 10:
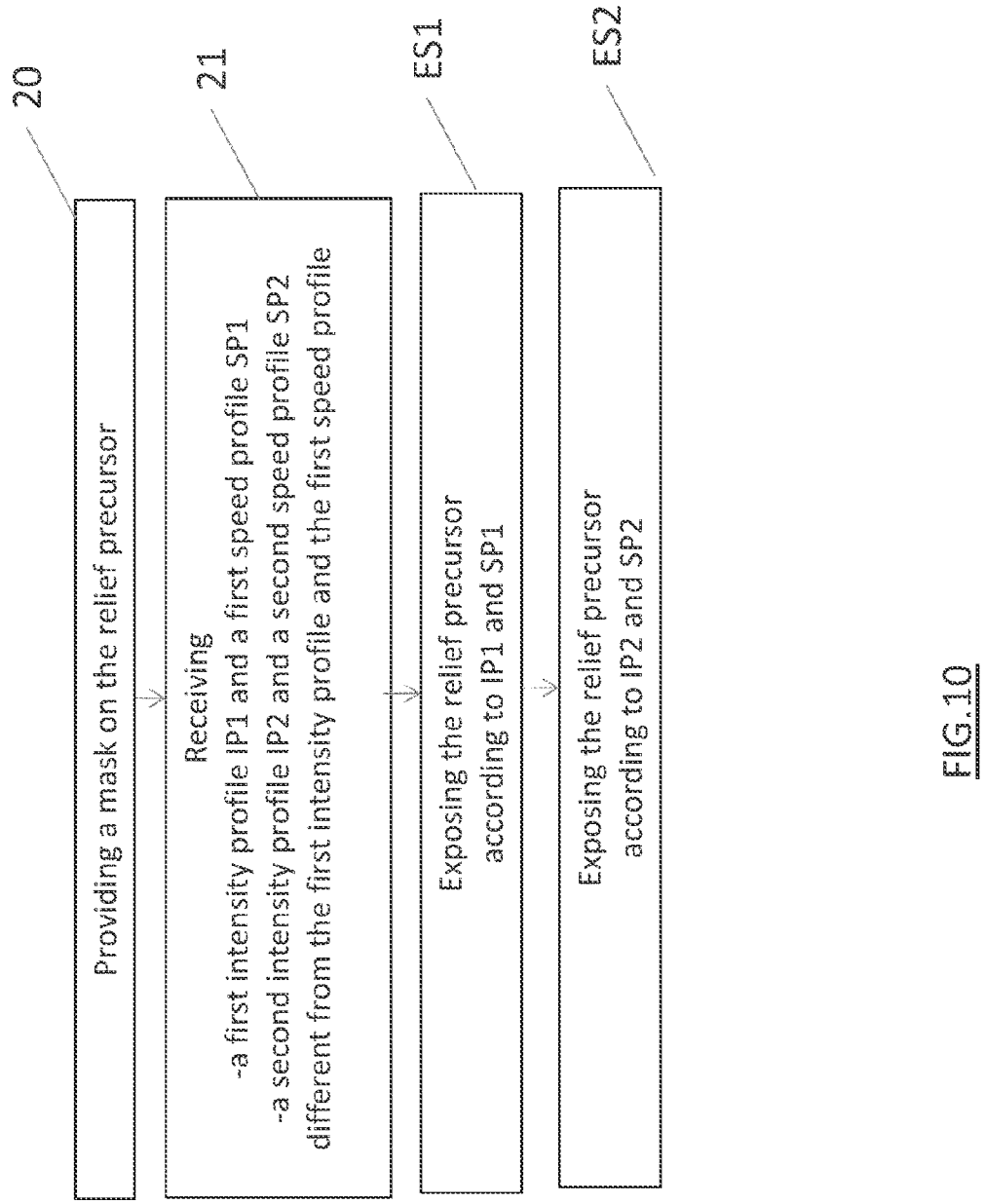
FIG. 10 is a flowchart of an exemplary embodiment of a method for exposure of relief precursor.

FIG. 10 is a flowchart of an exemplary embodiment of the method for exposure of relief precursor.

In an initial step 20, a mask 4 may be provided on a photosensitive layer of the relief precursor P. Next in a step 21, a first intensity profile IP1, a first speed profile SP1, a second intensity profile IP2 and a second speed profile SP2 may be received through an operator interface for the front exposure (the one or more first reciprocating movements M1; a, b). In addition or alternatively, one or more intensity and speed profiles for the back exposure (the one or more second reciprocating movements M2; d, e) may be received. Next the relief precursor P may be, in a first exposing step ES1, exposed according to the first intensity profile IP1 and the first speed profile SP1 and, in a second exposing step ES2, exposed according to the second intensity profile IP2 and the second speed profile SP2.

In an exemplary embodiment, all the profiles may be constant. For instance the first intensity profile IP1 and the second intensity profile IP2 may be such that the average intensity I1 during an exposure pass of the first exposing step ES1 may be higher than the average intensity I2 during an exposure pass of the second exposing step ES2. Similarly the first speed profile SP1 and the second speed profile SP2 may be such that the average speed S1 during an exposure pass of the first exposing step ES1 may be higher than the average speed S2 during an exposure pass of the second exposing step ES2. However, as discussed already previously, other profiles for the intensity and/or the speed during the first and/or second exposing step may also be envisaged.

As defined in FIGS. 8 and 9, by pass is meant a movement in a single direction to cover the whole surface of the relief precursor with the illumination area of the light source. Two consecutive passes in opposite directions may define a cycle. Each cycle may comprise one or two exposure passes. A cycle may indeed comprise a first pass in one direction during which exposure is performed and a second pass during which no exposure is performed and the light source is merely moved back into its initial position (like in FIG. 8). Alternatively, a cycle may comprise two exposure passes, wherein exposure is performed during back and forth movement of the light source (like in FIG. 9). In that context, the first exposing step ES1 may comprise a first number of passes n1 and/or the second exposing step ES2 may comprise a second number of passes n2. Typically the first and/or second number of passes, n1 and/or n2, may be received by the control means through the operator interface. The first number of passes n1 may be typically higher than the second number of passes n2. The first dose applied during a pass of the first exposing step ES1 may be lower than a dose applied during a pass of the second exposing step ES2.

For example, the front exposure may comprise a first exposing step ES1 comprising n1 relatively fast passes of the light source at a relatively high intensity I1 and a first relatively high speed S1 and a second exposing step ES2 comprising n2 relatively slow passes of the light source at a second relatively low intensity I2 and a second relatively low speed S2, with I1>I2 and S1>S2.

Figure 11:
FIG. 11 is a table containing data according to exemplary embodiments.

FIG. 11 is a table containing data according to exemplary embodiments for front exposure.

Two different relief precursors, labelled A and B, were exposed according to different first and second exposing steps. In these two examples the first exposing step ES1 comprised a plurality of fast passes during forward movement only while the second exposing step ES2 comprised one single slow pass (n2 was equal to one) during forward movement. Generally this sequence may be used to focus on first reducing oxygen inhibition in the relief precursor using high intensity to form flat dots during the first exposing step with fast passes while the second exposing step with a slow pass at a low intensity may complete curing with moderate heating of the precursor.

It is noted that before or after the first and/or second exposing step ES1, ES2, the back-exposure by the light source may be done. More generally, the timing and intensity of the exposing and moving steps by the light source may be controlled in any possible manner, and may be adjusted e.g. in function of the type of relief precursor.

For a precursor of type A with a thickness of 1.14 mm, for the front-exposure, first two passes at 460 mW/cm$^2$ with the light source were performed at a speed of 1000 mm/min with a dose per pass of 8.3 J/cm$^2$, followed by one pass at 370 mW/cm$^2$ with a speed of 350 mm/min and a dose of 18 J/cm$^2$. For a precursor of type B with a thickness of 2.84 mm, for the front-exposure, first two passes at 426 mW/cm$^2$ were performed at a speed of 6000 mm/min with a dose per pass of 1,275 J/cm$^2$, followed by one pass at 370 mW/cm$^2$ with a speed of 350 mm/min and a dose of 18 J/cm$^2$. For both types of precursors, using the above exposing parameters, flat dots of high quality were obtained at high efficiency.

Yet alternative embodiments in which the first exposing step may comprise one or more slow passes and the second exposing step may comprise one or more fast passes may also be envisaged. In particular in such an embodiment, the second exposing step would expose at a high intensity which could be used to complete curing of the relief precursor. Completion of curing is generally a separate post-treatment step such that when combining completion of curing and the second exposing step a total development time may be reduced.

Figure 12:
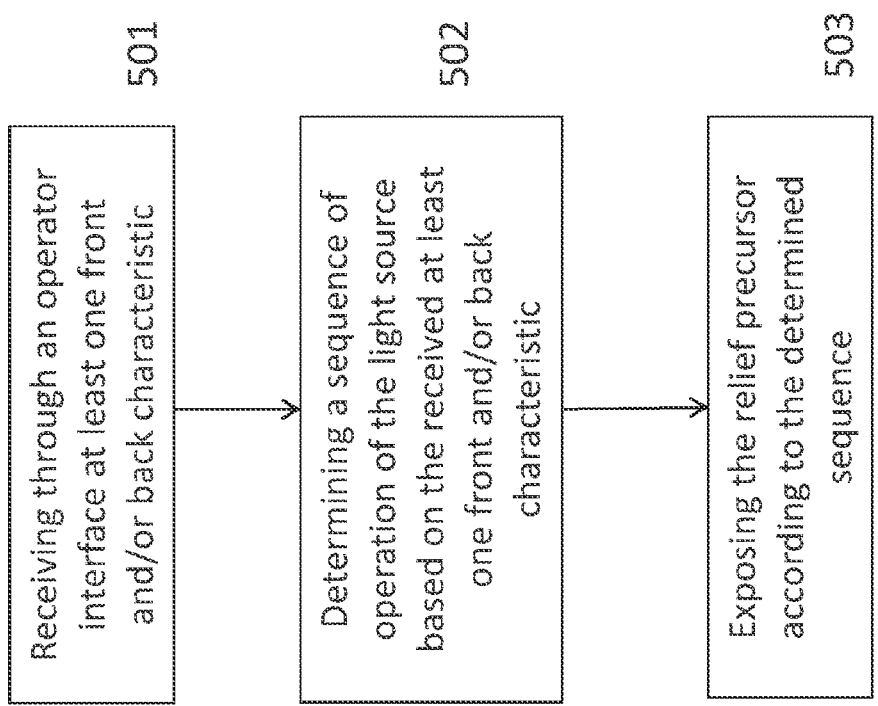
FIG. 12 is a flowchart of an exemplary embodiment of the method for exposure of a relief precursor.

FIG. 12 illustrates a flowchart of an exemplary embodiment of the method for exposure of relief precursor. The method comprises a step 501 of receiving through an operator interface at least one front representative for the one or more front exposure periods and/or at least one back characteristic representative for the one or more back exposure periods.

In a following step 502, a sequence of operation of the light source is determined based on the received at least one front and/or back characteristic. The method may determine the sequence taking into account criteria including:
the total duration of a sequence of operation to increase productivity;
the sequence of operation between exposure periods; for some relief precursors, the printing quality of the printing plate may decrease with the time separating consecutive exposures steps.

In a step 503, the method comprises exposing the relief precursor according to the determined sequence.

Figure 13:
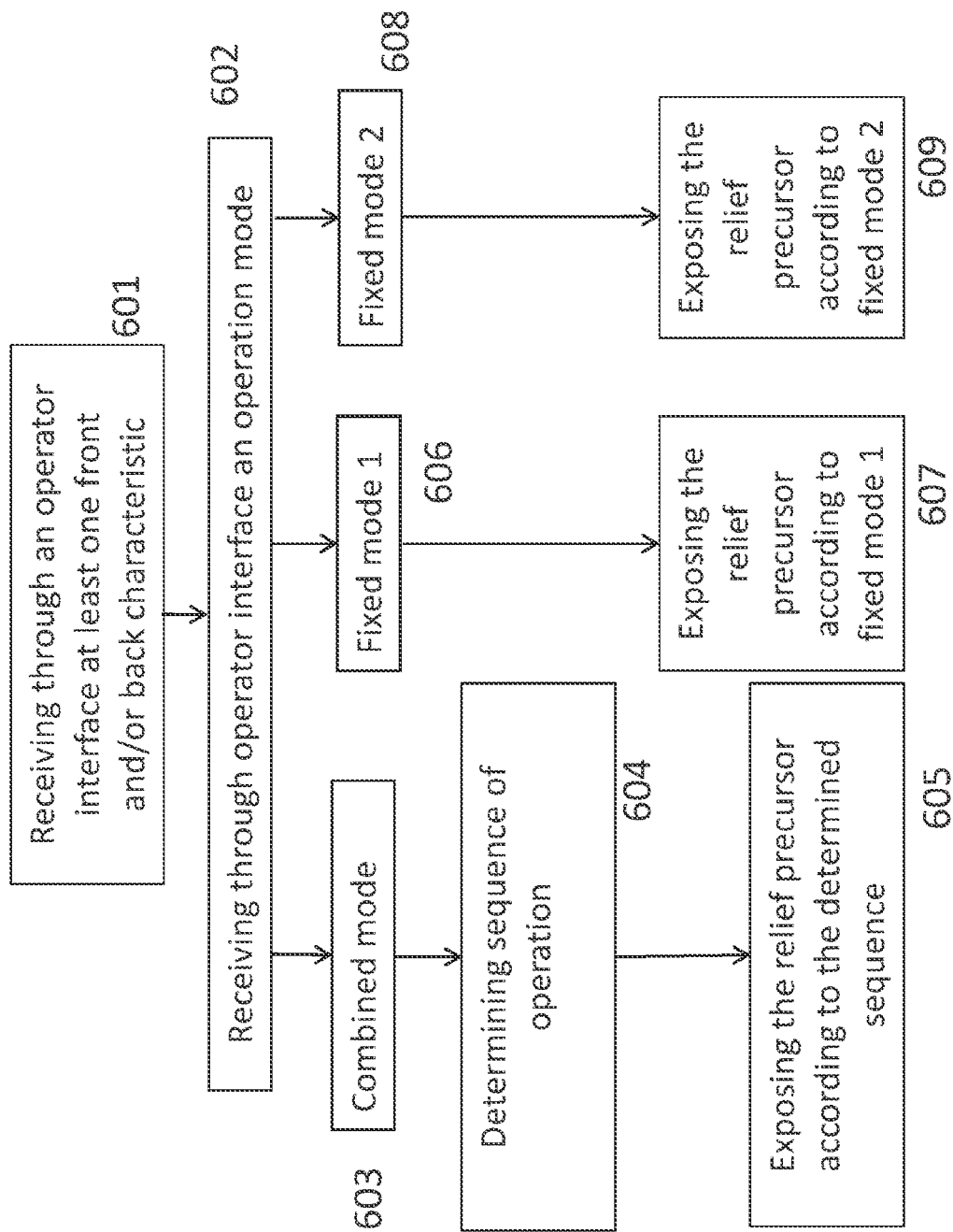
FIG. 13 is another flowchart of another exemplary embodiment of the method for exposure of a relief precursor.

FIG. 13 is another flowchart of another exemplary embodiment of the method for exposure of a relief precursor. In this exemplary embodiment, a mode of operation may further be received through the operator interface during step 602. The step 602 may be performed before or after a step 601 corresponding to step 502 of FIG. 12.

The mode of operation may either be:
a combined mode 603 wherein the control means determines automatically the sequence of operation, or
a first fixed mode 606 to perform e.g. a back exposure step before at least one front exposure step in a sequential manner,
a second fixed mode 608 to perform e.g. a back exposure step after the at least one front exposure step in a sequential manner.

Finally in steps 605, 607 and 608 the relief precursor may be exposed according to the sequence corresponding to the selected mode of operation. In this way an operator may operate his machine with fixed sequences for some types of known relief precursors while he may want to rely on the control means for the determination of a sequence for a new and unknown relief precursor.

Figure 14:
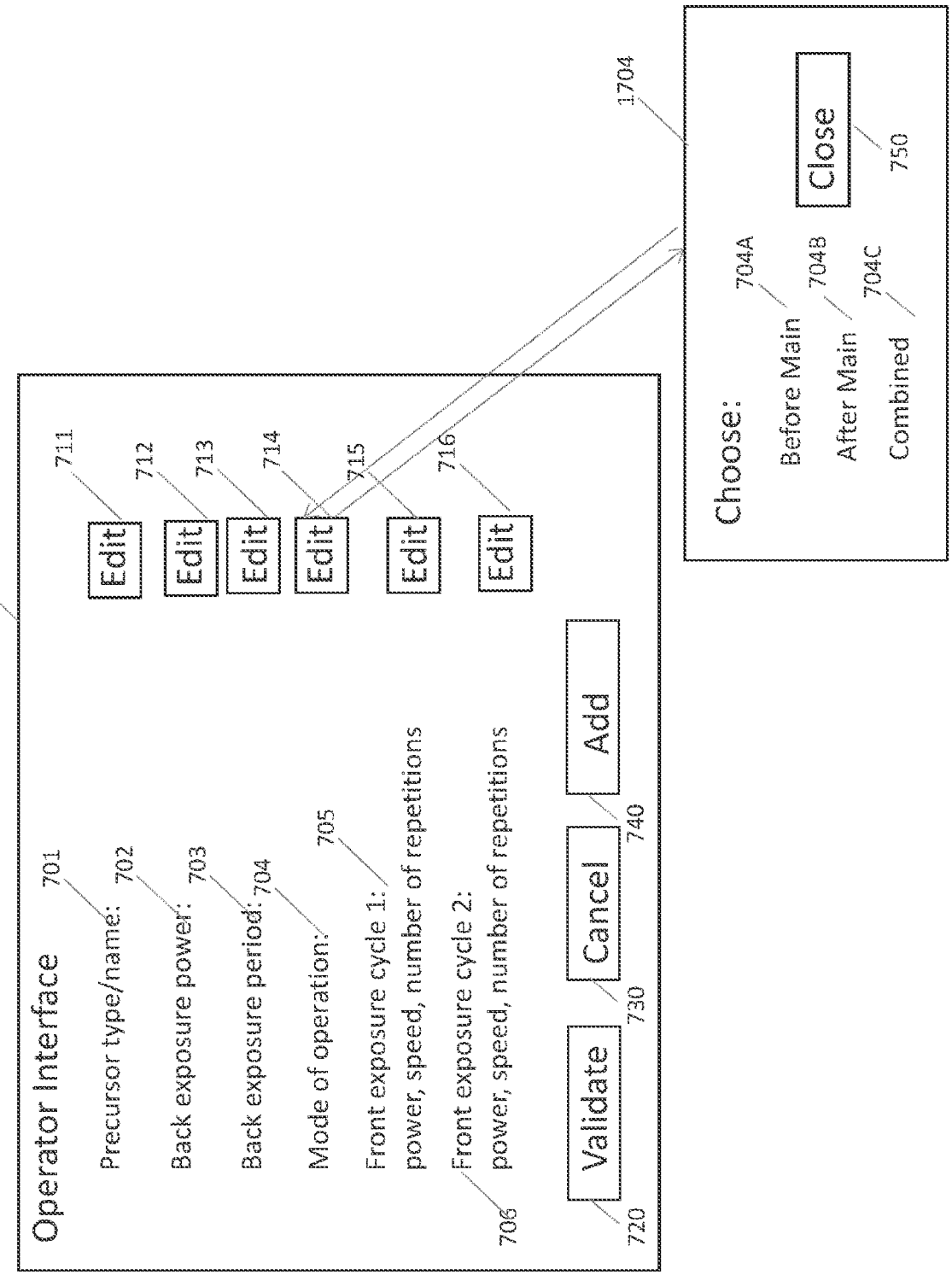
FIG. 14 illustrates a schematic view of an operator interface according to an exemplary embodiment of the invention.

FIG. 14 illustrates a schematic view of an operator interface according to an exemplary embodiment. The operator interface may be a graphical user interface with a window 700, comprising a plurality of editable fields 701-706 and associated buttons 711-716:
a field 701 may be present for the identification of the relief precursor.
fields 702-703 may relate to the back characteristic representative of the back exposure period. More in particular, a back exposure power 702 and a back exposure period 703 may be entered or changed.
fields 705 and 706 may relate to the at least one front characteristic representative of the at least one front exposure period, here two cycles of front exposure steps. In the illustrated example second characteristics for two different cycles of second exposure steps can be entered, e.g. power, speed and number of repetitions can be entered for a first cycle and for a second cycle. The total number of second exposure steps performed will thus be equal to the sum of the repetition numbers of the first and second cycle. It is noted that the interface may allow to set a profile where exposure takes place only during a forward movement of a cycle or only during a backward movement of a cycle or during both the forward and backward movement, see also the examples of FIGS. 8 and 9 discussed above.
a field 704 may be present for the mode of operation, cf. the example of FIG. 13.

To illustrate the general principle of operation of the graphical user interface, the edition of field 704 will now be described. When activating the button 714 associated with field 704, a new window 1704 may be opened. In the window 1704, an operator may select one of more options 704a-704c corresponding to the available modes of operation, namely in the example 'Before Main, 'After Main' or 'Combined'. Once a mode is selected, the activation of a button 750 may close the window 1704, returning to the window 700. It is to be understood that windows similar to window 1704 may be opened to edit each of the editable fields 701-703, 705 and 706. A button 720 may be activated to validate all the fields 701-706 to complete the step of receiving information through the operator interface 7. A button 730 may be activated to cancel the edition of the fields 701-706 since the last step of receiving information through the operator interface. A button 740 may be activated to add more editable fields to the window 700. A skilled person would understand that other ways of editing the graphical interface may be envisaged as long as information may be received from an operator.

In non-illustrated embodiments, a post-treatment unit may be provided to perform a post-treatment on the relief precursor, e.g. washing, drying, post-exposure, heating, cooling, removing of material, etc. Further, in non-illustrated embodiments, a pre-treatment unit may be provided to perform a pre-treatment on the relief precursor, said pre-treatment being selected from the group comprising: cutting, ablation, exposure to electromagnetic radiation, and combinations thereof.

A relief precursor generally comprises a support layer and at least one photosensitive layer. The support layer may be a flexible metal, a natural or artificial polymer, paper or combinations thereof. Preferably the support layer is a flexible metal or polymer film or sheet. In case of a flexible metal, the support layer could comprise a thin film, a sieve like structure, a mesh like structure, a woven or non-woven structure or a combination thereof. Steel, copper, nickel or aluminium sheets are preferred and may be about 50 to 1000 µm thick. In case of a polymer film, the film is dimensionally stable but bendable and may be made for example from polyalkylenes, polyesters, polyethylene terephthalate, polybutylene terephthalate, polyamides and polycarbonates, polymers reinforced with woven, nonwoven or layered fibres (e.g. glass fibres, Carbon fibres, polymer fibres) or combinations thereof. Preferably polyethylene and polyester foils are used and their thickness may be in the range of about 100 to 300 µm, preferably in the range of 100 to 200 µm.

A relief precursor may carry at least one additional layer. For example, the additional layer may be any one of the following: a direct engravable layer (e.g. by laser), a solvent or water developable layer, a thermally developable layer, a photosensitive layer, a combination of a photosensitive layer and a mask layer. Optionally there may be provided one or more further additional layers on top of additional layer. Such one or more further additional layers may comprise a cover layer at the top of all other layers which is removed before the imageable layer is imaged. The one or more additional layers may comprise a relief layer, and an antihalation layer between the support layer and the relief layer or at a side of the support layer which is opposite of the relief layer. The one or more additional layers may comprise a relief layer, an imageable layer, and one or more barrier layers between the relief layer and the imageable layer which prevent diffusion of oxygen. Between the different layers described above one or more adhesion layers may be located which ensure proper adhesion of the different layers.

In a preferred embodiment the relief precursor comprises a support layer made of a polyester of polymer material, and an additional layer made of a directly engravable material such as a resin material. The optional layer may then be a laser ablative layer. In an exemplary embodiment the relief precursor may contain at least a dimensionally stable support layer, a relief layer and an imageable mask layer. Optionally, further layers may be present. There may be a cover layer at the top of all other layers which is removed before the imageable mask layer is imaged. There may be an anti-halation layer between the support layer and the relief layer or it may be located at the side of the support layer which is opposite of the relief layer. There may be one or more barrier layers between the relief layer and the imageable mask layer which prevent diffusion of oxygen. Between the different layers described above one or more adhesion layers may be located which ensure proper adhesion of the different layers. One or more layers may be removable by treatment with a liquid. The liquids used may be the same or different for different layers. Preferably the liquids used are different.

In a preferred embodiment the relief precursor comprises a photosensitive layer and a mask layer. The mask layer may be ablated or changed in transparency during the treatment and forms a mask with transparent and non-transparent areas. Preferably the mask layer and/or the barrier layer are removed in the pre-washing section of the apparatus because they may comprise material which could cause problems in further process steps or during use of the final relief. Underneath of transparent areas of the mask the photosensitive layer undergoes a change in solubility and/or fluidity upon irradiation. The change is used to generate the relief by removing parts of the photosensitive layer in one or more subsequent steps. The change in solubility and/or fluidity may be achieved by photo-induced polymerization and/or crosslinking, rendering the irradiated areas less soluble. In other cases the electromagnetic radiation may cause breaking of bonds or cleavage of protective groups rendering the irradiated areas more soluble. Preferably a process using photo-induced crosslinking and/or polymerization is used.

Liquids which may be used to remove material from the exposed precursor include amongst others: Water, aqueous solutions, solvents and combinations thereof. The nature of the liquid used is guided by the nature of the precursor employed. If the layer to be removed is soluble, emulsifiable or dispersible in water or aqueous solutions, water or aqueous solutions might be used. If the layer is soluble, emulsifiable or dispersible in organic solvents or mixtures, organic solvents or mixtures may be used. In the case of organically developable precursors different organic solvents or their mixtures may be used.

Removal of material from the exposed precursor may also be performed by heating and removal of liquefied material with a developing material. The developing material may be a web of film which is brought into contact with the precursor and continuously.

Whilst the principles of the invention have been set out above in connection with specific embodiments, it is to be understood that this description is merely made by way of example and not as a limitation of the scope of protection which is determined by the appended claims.

The invention claimed is:

1. An apparatus for exposure of a relief precursor comprising at least one photosensitive layer, said relief precursor having a first side and an opposite second side, said apparatus comprising:
   a light source configured to expose the relief precursor during relative movement between the light source and the relief precursor;
   a moving means configured:
      to cause a first relative movement between the light source and the relief precursor to expose the first side of the relief precursor,
      to cause a second relative movement between the light source and the relief precursor to expose the second side of the relief precursor, and
      to move the light source between a first position and a second position, said first and second positions being on opposite sides of a plane of the relief precursor;
      wherein at least one of the first and the second relative movement is a reciprocating movement; and
   a control means configured to control the movement means and/or the light source such that the at least one first reciprocating movement comprises a first exposing step comprising exposing during one or more exposure passes the relief precursor according to a first intensity profile and a first speed profile; a second exposing step comprising exposing during one or more exposure passes the relief precursor according to a second intensity profile different from the first intensity profile and/or a second speed profile different from the first speed profile.

2. The apparatus according to claim 1, wherein the light source has an emitting side and a non-emitting side and wherein the moving means is configured to rotate the light source, preferably 180°, when moving the light source between the first position in which the emitting side faces the first side of the relief precursor and the second position in which the emitting side faces a second side of the relief precursor; wherein preferably the light source is substantially planar.

3. The apparatus according to claim 1, wherein the light source substantially extends in a plane intended for being parallel to the relief precursor, and wherein the first and second relative movement are in a direction parallel to the plane of the relief precursor.

4. The apparatus according to claim 1, wherein the control means is configured to control the movement means to perform consecutively:
   at least one first reciprocating movement to expose the first side of the relief precursor;
   a movement from the first position to the second position;
   at least one second reciprocating movement to expose the second side of the relief precursor;
   a movement from the second position to the first position.

5. The apparatus according to claim 1, wherein the control means is configured to adjust the intensity of the light emitted by the light source so that the intensity during the first relative movement is different from the intensity during the second relative movement; and/or to adjust the speed of the first and second relative movement.

6. The apparatus according to claim 1, wherein an average speed during an exposure pass of the first exposing step is higher than an average speed during an exposure pass of the second exposing step; and/or wherein the first exposing step consists of a first number of exposure passes and the second exposing step consists of a second number of exposure passes which is different from the first number of exposure passes.

7. The apparatus according to claim 1, wherein the at least one first reciprocating movement comprises one or more front exposure steps during one or more front exposure periods, and the at least one second reciprocating movement comprises one or more back exposure steps during one or more back exposure periods, wherein the apparatus comprises an operator interface configured to receive at least one front characteristic representative for the one or more front exposure periods and/or at least one back characteristic representative for the one or more back exposure periods; and wherein the control means is configured for determining a sequence of operation for the light source based on the at least one front and/or back characteristic.

8. The apparatus according to claim 7, wherein the at least one back characteristic comprises any one of the following or a combination thereof: a speed value for the speed of the movement of the light source during the one or more back exposure steps, a number of times the same back exposure step is repeated, a duration of a back exposure period of said one or more back exposure periods, a value representative for a light intensity used during the one or more back exposure periods; and wherein the at least one front characteristic comprises any one of the following or a combination thereof: a speed value for the speed of the movement of the light source during the one or more front exposure steps, a number of times the same front exposure step is repeated, a duration of a front exposure period of said one or more front exposure periods, a value representative for a light intensity used during the one or more front exposure periods.

9. The apparatus according to claim 1, wherein the light source has an emitting area with a length to width ratio lower than 7, preferably between 3 and 7, more preferably lower than 5, even more preferably between 3 and 5.

10. The apparatus according to claim 1, wherein the moving means is configured so that the movement of the light source is not a circular movement around the object; and/or wherein the moving means is configured to perform a relative movement between relief precursor and the light source along a direction perpendicular to the relief precursor plane.

11. The apparatus according to claim 1, comprising a carrying structure for supporting the relief precursor, wherein the carrying structure is configured to support the relief precursor so that a plane thereof is oriented vertically during an exposure by the light source; or a carrying structure for supporting the relief precursor, wherein the carrying structure is configured to support the relief precursor so that it is oriented horizontally during exposure by the light source, wherein the carrying structure comprises an at least partially transparent support, such as a glass plate, a polymer plate, a transparent mesh, a set of rollers, a set of transparent tubes such as a set of light tubes.

12. The apparatus according to claim 1, wherein the apparatus comprises a housing with an entrance and an exit for a relief precursor, wherein the entrance and exit are at the same or opposite sides of the housing, wherein preferably the entrance and/or exit are connectable to another unit.

13. The apparatus according to claim 1, further comprising a transport system configured to transport the relief precursor into the apparatus in a transport direction, and optionally out of the apparatus; wherein preferably the direction of the first and second relative movement between relief precursor and light source is perpendicular or parallel to the transport direction; wherein preferably the transport system comprises at least one attachment means to attach the relief precursor to a transport means of the transport system.

14. The apparatus according to claim 1, further comprising a cooling means configured to cool the relief plate precursor and/or the light source.

15. A method for exposing a relief precursor comprising at least one photosensitive layer, said method comprising the following steps:
   providing a relief precursor,
   optionally performing a pre-exposure with an additional light source,
   performing a first relative movement between a light source and the relief precursor whilst exposing a first side of the relief precursor,
   moving the light source from a first position facing the first side to a second position facing a second side of the relief precursor; and
   performing a second relative movement between the light source and the relief precursor whilst exposing the second side of the relief precursor,
   wherein at least one of the first and the second relative movement is a reciprocating movement; and
   controlling the performing of the first relative movement so that at least one first reciprocating movement is performed to expose the first side of the relief precursor, wherein the at least one first reciprocating movement comprises a first exposing step comprising exposing during one or more exposure passes the relief precursor according to a first intensity profile and a first speed profile and a second exposing step comprising exposing during one or more exposure passes the relief precursor according to a second intensity profile different from the first intensity profile and/or a second speed profile different from the first speed profile.

16. The method according to claim 15, wherein the light source has an emitting side and a non-emitting side and wherein the moving step comprises rotating the light source, preferably 180°, when moving the light source from the first position in which the emitting side faces the first side of the relief precursor to the second position in which the emitting side faces the second side of the relief precursor; wherein preferably the first and second relative movement are in a direction parallel to the plane of the relief precursor.

17. The method according to claim 15, further comprising:
controlling the performing of a first relative movement means so that at least one first reciprocating movement is performed to expose the first side of the relief precursor;
controlling the performing of a second relative movement means so that at least one second reciprocating movement is performed to expose the second side of the relief precursor.

18. The method according to claim 15, further comprising,
after performing of the second relative movement, moving the light source from the second position back to the first position; and/or
adjusting the intensity of the light source so that the intensity used during the first relative movement is different from the intensity used during the second relative movement; and/or
performing a relative movement between the relief precursor and the light source along a direction perpendicular to the relief precursor plane.

19. An apparatus for exposure of a relief precursor comprising at least one photosensitive layer, said relief precursor having a first side and an opposite second side, said apparatus comprising:
a light source configured to expose the relief precursor during relative movement between the light source and the relief precursor;
a moving means configured:
to cause a first relative movement between the light source and the relief precursor to expose the first side of the relief precursor,
to cause a second relative movement between the light source and the relief precursor to expose the second side of the relief precursor, and
to move the light source between a first position and a second position, said first and second positions being on opposite sides of a plane of the relief precursor;
wherein at least one of the first and the second relative movement is a reciprocating movement;
a control means configured to control the movement means and/or the light source;
wherein the at least one first reciprocating movement comprises one or more front exposure steps during one or more front exposure periods, and the at least one second reciprocating movement comprises one or more back exposure steps during one or more back exposure periods, wherein the apparatus comprises an operator interface configured to receive at least one front characteristic representative for the one or more front exposure periods and/or at least one back characteristic representative for the one or more back exposure periods; and wherein the control means is configured for determining a sequence of operation for the light source based on the at least one front and/or back characteristic.

* * * * *